United States Patent
Oh et al.

(10) Patent No.: US 9,064,724 B2
(45) Date of Patent: Jun. 23, 2015

(54) THREE-DIMENSIONAL NON-VOLATILE MEMORY DEVICE WITH STACKED-STRUCTURE MEMORY BLOCKS

(71) Applicant: SK hynix Inc., Icheon-si Gyeonggi-do (KR)

(72) Inventors: Sung Lae Oh, Cheongju-si (KR); Sang Hyun Sung, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/846,898

(22) Filed: Mar. 18, 2013

(65) Prior Publication Data

US 2014/0110795 A1    Apr. 24, 2014

(30) Foreign Application Priority Data

Oct. 24, 2012    (KR) .................. 10-2012-0118466

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 27/088* | (2006.01) |
| *H01L 29/78* | (2006.01) |
| *H01L 27/108* | (2006.01) |
| *H01L 27/02* | (2006.01) |
| *H01L 27/115* | (2006.01) |

(52) U.S. Cl.
CPC .............. *H01L 27/088* (2013.01); *H01L 29/78* (2013.01); *H01L 27/10855* (2013.01); *H01L 27/0207* (2013.01); *H01L 27/11573* (2013.01)

(58) Field of Classification Search
CPC ..................... H01L 27/10855; H01L 27/0207; H01L 27/088; H01L 21/76895; H01L 21/76897; H01L 29/78
USPC .......................................................... 257/401
See application file for complete search history.

(56) References Cited

U.S. PATENT DOCUMENTS

| | | | | |
|---|---|---|---|---|
| 6,051,884 | A * | 4/2000 | Papadas .......................... | 257/774 |
| 6,573,570 | B2 * | 6/2003 | Oguchi ............................ | 257/382 |
| 6,700,169 | B2 * | 3/2004 | Kuroki ............................. | 257/401 |
| 2010/0320526 | A1 * | 12/2010 | Kidoh et al. ..................... | 257/324 |

FOREIGN PATENT DOCUMENTS

KR    1020120075882 A    7/2012

* cited by examiner

*Primary Examiner* — Howard Weiss
(74) *Attorney, Agent, or Firm* — William Park & Associates Ltd.

(57) ABSTRACT

A semiconductor device includes a substrate where a cell region and a contact region are defined, an isolation region and an active region disposed alternately in the contact region, transistors configured to include a gate formed over the substrate and a source and a drain formed in the active region at both sides of the gate, in the contact region, memory blocks configured to include conductive lines stacked over the substrate and formed over the transistors, the conductive lines being extended from the cell region to the contact region in the direction crossing over the isolation region and the active region, and contact plugs formed between the memory blocks in the contact region.

18 Claims, 23 Drawing Sheets

Cell region | Contact region

Cell region | Contact region

THREE-DIMENSIONAL NON-VOLATILE MEMORY DEVICE WITH STACKED-STRUCTURE MEMORY BLOCKS

CROSS-REFERENCE TO RELATED APPLICATION

This application claims priority from Korean Patent Application No. 10-2012-0118466, filed on Oct. 24, 2012, the contents of which are incorporated herein by reference in its entirety.

BACKGROUND

1. Technical Field

The present invention generally relates to a semiconductor device and a method of manufacturing the same, more particularly relates to a three-dimensional non-volatile memory device and a method of manufacturing the same.

2. Related Art

Memory cells may be formed with a three-dimensional structure on a semiconductor substrate, to enhance integrity of a semiconductor device. The memory cells are stacked on the semiconductor substrate, and form memory strings.

The memory cells in the three-dimensional semiconductor device are coupled to word lines stacked on the semiconductor substrate. Word lines formed in a cell region are coupled to global lines through transistors formed in a peripheral region. The global lines are formed in the peripheral region, and deliver operation voltages.

The stack number of the word lines gets higher in the event that the stack number of the memory cells in the three-dimensional semiconductor device increases. If the stack number of the word lines increases, the layout of the patterns for coupling the word lines to transistors, patterns for coupling the global lines to the transistors, and patterns coupled to gates of the transistors may become irregular and more complicated, or an area of the layout may increase.

SUMMARY OF THE INVENTION

Embodiments of the present invention provide a semiconductor device for reducing an area of a peripheral region and simplifying the layout of the patterns and a method of manufacturing the same.

A semiconductor device according to an embodiment of the present invention includes a substrate where a cell region and a contact region are defined; an isolation region and an active region disposed alternately in the contact region; transistors configured to include a gate formed over the substrate and a source and a drain formed in the active region at both sides of the gate, in the contact region; memory blocks configured to include conductive lines stacked over the substrate and formed over the transistors, the conductive lines being extended from the cell region to the contact region in the direction crossing over the isolation region and the active region; and contact plugs formed between the memory blocks in the contact region.

A method of manufacturing a semiconductor device according to an embodiment of the present invention includes forming an isolation layer in an isolation region of a substrate where a cell region and a contact region are defined, wherein an active region and the isolation region are disposed alternately in the contact region; forming transistors including a gate, a source and a drain in the contact region; forming memory blocks including conductive lines stacked over the transistors, the conductive lines being extended from the cell region to the contact region in the direction crossing over the isolation region and the active region; and forming contact plugs disposed between the memory blocks in the contact region.

The embodiments may form transistors in a contact region of memory blocks, thereby reducing the area of a peripheral region. The transistors may be formed in the peripheral region when using a conventional technique.

In the embodiments, an active region and an isolation region may be alternately disposed in the contact region, and the extension direction of an active region may cross over the extension direction of a conductive line in the memory block. As a result, patterns for coupling transistors to the memory blocks may be regularly disposed.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

Figure 1A:
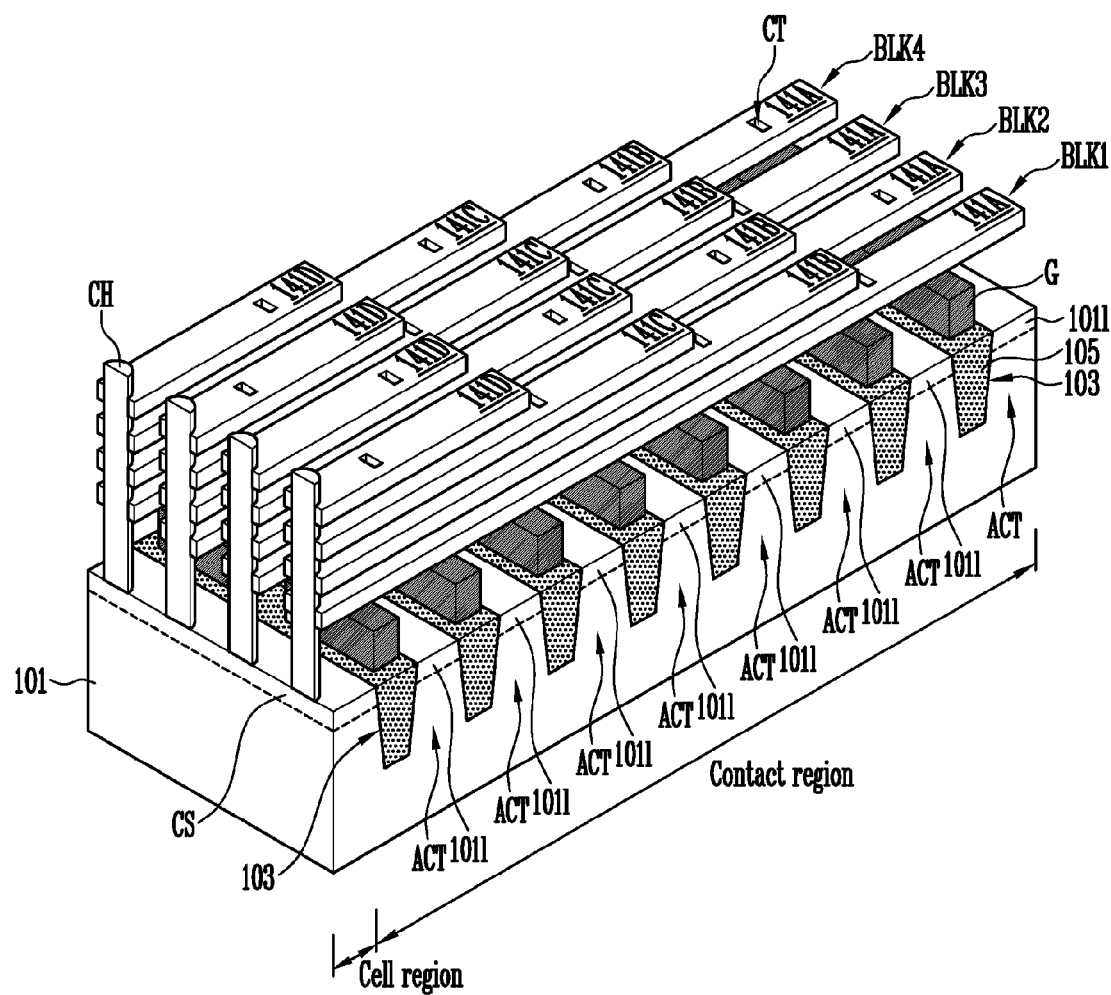
FIG. 1a and FIG. 1b are views illustrating a semiconductor device according to first embodiments of the present invention.
Figure 1B:
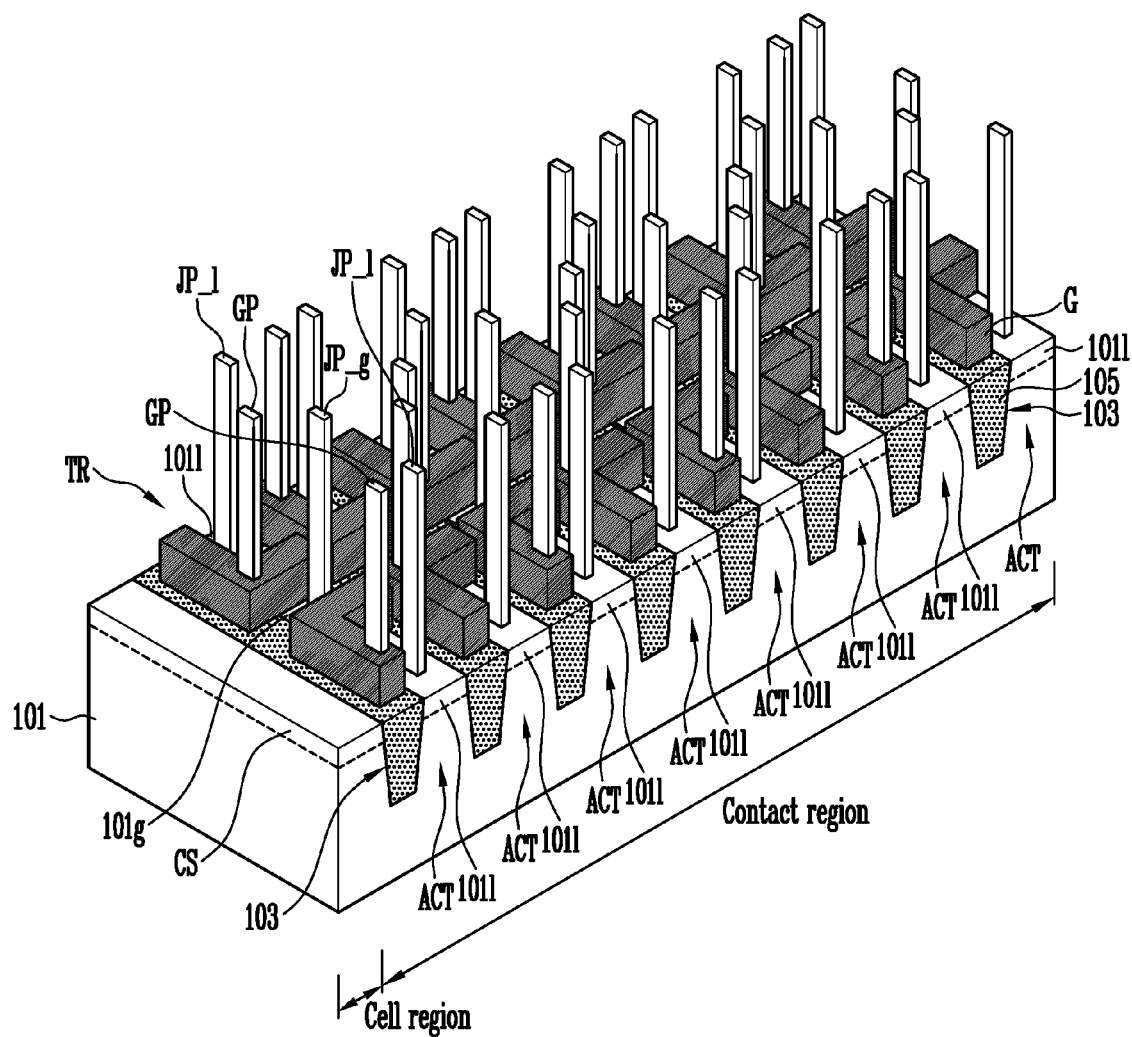

FIG. 1a and FIG. 1b are views illustrating a semiconductor device according to first embodiments of the present invention. FIG. 1a shows a substrate, conductive lines and a memory string, and FIG. 1b illustrates contact plugs coupled to transistors in a contact region.

As shown in FIG. 1a and FIG. 1b, a semiconductor device of the present embodiments may include a cell region and a contact region. Memory blocks BLK1 to BLK4 may be formed over a substrate 101 where the cell region and the contact region are defined. Transistors TR may be formed in the contact region, and deliver operation voltages to the memory blocks BLK1 to BLK4 in response to a block select signal. Particularly, the memory blocks BLK1 to BLK4 are disposed over the transistors TR. The present embodiments may not form the transistors TR for delivering the operation voltages to the memory blocks BLK1 to BLK4 in the peripheral region but may form the transistors TR in the contact region, thereby reducing an area of the peripheral region.

In FIG. 1a, each of the memory blocks BLK1 to BLK4 may include a channel layer CH projected from the substrate 101 in the cell region and conductive lines 141A to 141D which cover the channel layer CH and are stacked over the substrate 101. The conductive lines 141A to 141D are extended in the direction from the cell region to the contact region. The conductive lines 141A to 141D are further projected in the direction of the contact region accordingly as space between corresponding conductive line and the substrate 101 become smaller. That is, the conductive lines 141A to 141D may be patterned with a stepwise structure in the contact region. An interlayer dielectric layer (not shown) may be formed between adjoining conductive lines 141A to 141D. The stack number of the conductive lines 141A to 141D may be variously changed according to the number of memory cells to be stacked and the number of select transistors to be stacked.

One or more conductive lines, e.g. 141A from the lowest conductive line of the conductive lines 141A to 141D and at least one conductive line, e.g. 141D from the uppermost conductive line of the conductive lines 141A to 141D may be used as select lines for select transistors. Conductive lines, e.g. 141B and 141C between the select lines may be used as word lines of memory cells. The select transistors may be formed in a cross region of the select lines and the channel layer CH, and the memory cells may be formed in a cross region of the word lines and the channel layer CH. As a result, a memory string, where the memory cells stacked between the select transistors are coupled in serial by the channel layer CH, may be formed. A cell source region CS may be formed in the cell region of the substrate 101, and the cell source region CS may be connected to the channel layer CH.

A multi-layer (not shown) may be further formed between the channel layer CH and the conductive lines 141B and 141C for the word line, it including a tunnel insulating layer, a charge trap layer and a charge blocking layer. A gate insulating layer may be further formed between the channel layer CH and the conductive lines 141A and 141D for the select line. The gate insulating layer may be formed with an oxide layer or with substantially the same material layers as the multi-layer.

A pair of the channel layers CH may be connected by a pipe transistor, which is not shown. In this case, the memory string may include first and second memory cell groups stacked over both terminals of the pipe transistor, a drain select transistor stacked over the first memory cell group and a source select transistor stacked over the second memory cell group. The pipe transistor may include a pipe channel layer for connecting a pair of the channel layers CH, a pipe gate covering the pipe channel layer and a gate insulating layer formed between the pipe gate and the pipe channel layer.

The substrate 101 may include an isolation region and an active region ACT alternately disposed in the contact region. The isolation region and the active region ACT may be extended in the direction crossing over the conductive lines 141A to 141D. A trench 103 and an isolation layer 105 may be formed in the isolation region, the isolation layer 105 filling in the trench 103 and dividing the active region ACT.

In FIG. 1b, each of the transistors TR may include a gate G formed over the substrate 101 in the contact region. Respective gates G may include a first part formed over the active region ACT in the direction crossing over the active region ACT and a second part formed over the isolation layer 105, the second part being extended from the first part in the direction crossing the conductive lines (141A to 141D in FIG. 1a). The second part of the gate G may be connected to a gate contact plug GP. The gate contact plug GP connected to the gate G may be disposed in the contact hole (CT in FIG. 1a) passing through the conductive lines 141A to 141D. The first part and the second part of the gate G will be described in detail with reference to accompanying drawing FIG. 3a.

Each of the transistors TR may include impurity regions formed in the active region at both sides of the gate G. The impurity regions are used as a source 101*l* or a drain 101*g* of the transistor. Since the active area ACT may be formed in the direction crossing the conductive lines 141A to 141D, the impurity regions formed in the active region ACT may be opened between the memory blocks BLK1 to BLK4. Accordingly, the present embodiments may dispose every contact plug JP_l and JP_g in the contact region between the memory blocks BLK1 to BLK4, and form regular pad patterns for connecting the contact plugs JP_l and JP_g. The contact plugs JP_l and JP_g are to be connected to the source 101*l* and the drain 101*g* of respective transistors TR. The contact plugs JP_l and JP_g and the pad patterns will be described in detail with reference to accompanying drawings FIG. 6a to FIG. 8b.

Hereinafter, a method of manufacturing a semiconductor device according to first embodiments of the present invention will be described in detail with reference to accompanying drawings FIG. 2a to FIG. 8b.

Figure 2A:
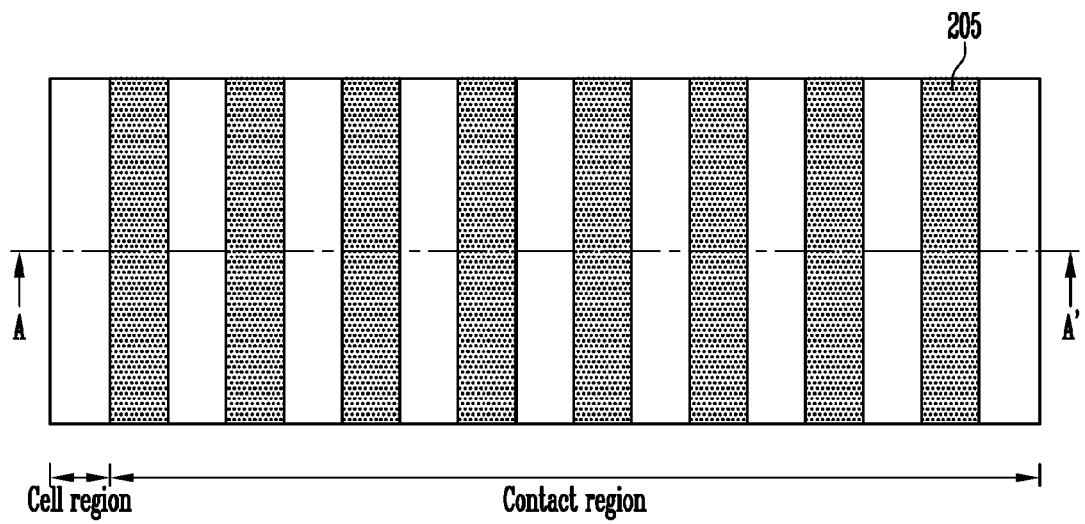
FIG. 2a and FIG. 2b are a plan view and a sectional view illustrating a process of forming an isolation layer and an active region.
Figure 2B:
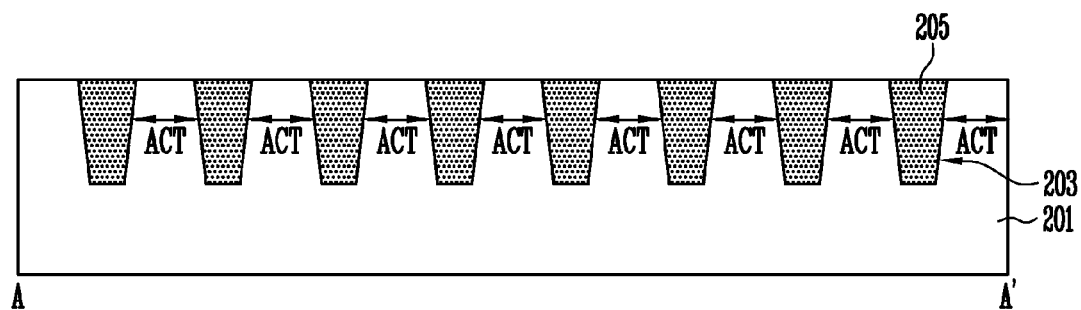

FIG. 2a and FIG. 2b are a plan view and a sectional view illustrating a process of forming an isolation layer 205 and the active region ACT. FIG. 2b shows section taken along the line A-A' in FIG. 2a.

In FIG. 2a and FIG. 2b, trenches 203 may be formed in a substrate 201 where a cell region and a contact region are defined. The trenches 203 may be formed in the contact region. The trenches 203 may be formed by etching the substrate 201 using an isolation mask as an etch barrier after forming the isolation mask over the substrate 201. The isolation mask opens a region where the trenches 203 are to be formed and blocks the cell region.

Isolation layers 205 may be formed by filling insulating material in the trenches 203 after the trenches 203 may be formed. Subsequently, the isolation mask is removed. The isolation layers 205 may be planarized through a planarization process. A region of the substrate 201 separated by the isolation layers 205 in the contact region is defined as the active regions ACT. The isolation layers 205 and the active regions ACT are alternately disposed in the contact region.

Figure 3A:
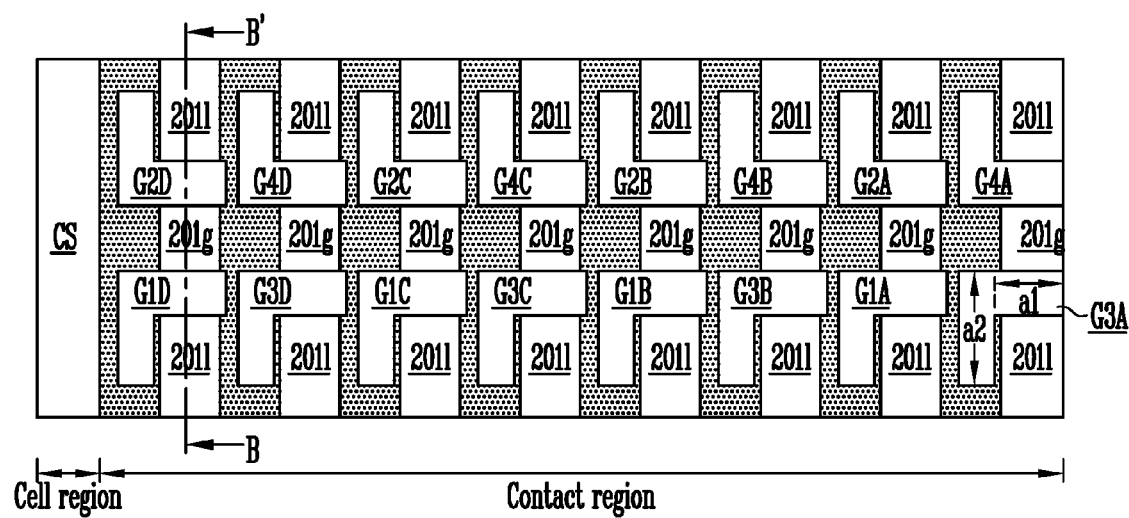
FIG. 3a and FIG. 3b are a plan view and a section view illustrating a process of forming gates of transistors and impurity regions.
Figure 3B:
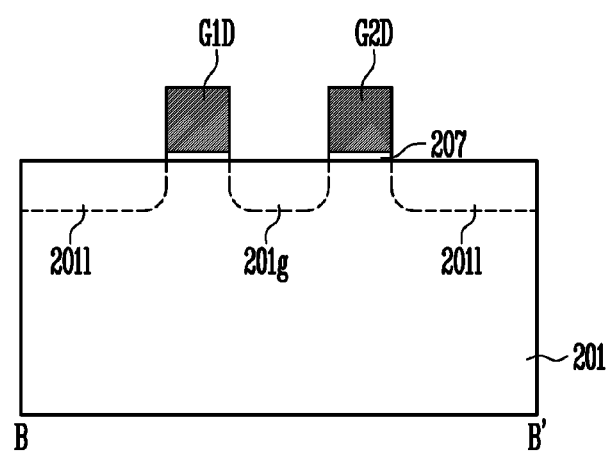

FIG. 3a and FIG. 3b are a plan view and a section view illustrating a process of forming gates G1A to G4D of transistors and impurity regions CS, 201*g* and 201*l*. FIG. 3b shows a section taken along the line B-B' in FIG. 3a.

In FIG. 3a and FIG. 3b, a gate insulating layer 207 and a gate conductive layer are stacked over the substrate 201 including the isolation layers 205, to form the gates G1A to G4D. Subsequently, the gates G1A to G4D may be formed by etching the gate conductive layer through an etching process using a gate mask as an etch barrier. Here, the gate insulating layer 207 may be further etched. The gate mask may be removed after the gates G1A to G4D are formed.

Each of the gates G1A to G4D may include a first part a1 formed over the active region ACT and a second part a2 formed over the isolation layer 205 extending from the first part a1. The first part a1 may be extended in the direction crossing over the active region ACT, and the second part a2 may be extended in the direction crossing over the first part a1. The gates G1A to G4D may be divided into gates G1D, G3D, G1C, G3C, G1B, G3B, G1A and G3A of a first group for transistors for delivering operation voltages to odd-numbered memory blocks and gates G2D, G4D, G2C, G4C, G2B, G4B, G2A and G4A of a second group for transistors for delivering operation voltages to even-numbered memory blocks. The number of the gates in each of the groups may be substantially identical to that of conductive lines to be stacked over the substrate 201 in following process. The first part a1 of the gates in the first group and the first part a1 of the gates in the second group may face each other, and may be symmetrically disposed. The active region ACT may be opened between the gates in the first group and the gates in the second group.

Next, first impurity regions 201g and 201l may be formed by injecting impurities in the active regions ACT using the gates G1A to G4D as barriers, they may correspond to the source and the drain of respective transistors. Here, the impurities may be injected after the cell region is blocked by a mask. Subsequently, the mask for blocking the cell region may be removed, and a mask for blocking the contact region may be formed. Next, a second impurity region CS may be formed by injecting impurities in the cell region of the substrate 201, it indicating a cell source region to be connected to the memory string. Subsequently, the mask for blocking the contact region may be removed. In an embodiment, the first and the second impurity regions 201g, 201l and CS may be simultaneously formed by performing a one time process of injecting impurities. Trivalent impurities or pentavalent impurities may be injected in the first and the second impurity regions 201g, 201l and CS.

The first impurity regions formed in the active regions ACT between the gates in the first and the second groups become the drains 201g, and the other first impurity regions become the sources 201l. As a result, the transistors including the gate, the source and the drain may be formed. The transistors may be divided into transistors in a first group for delivering the operation voltages to the odd-numbered memory blocks and transistors in a second group for delivering the operation voltages to the even-numbered memory blocks. Adjacent transistors in the first and the second groups share the drain 201g.

Figure 4A:
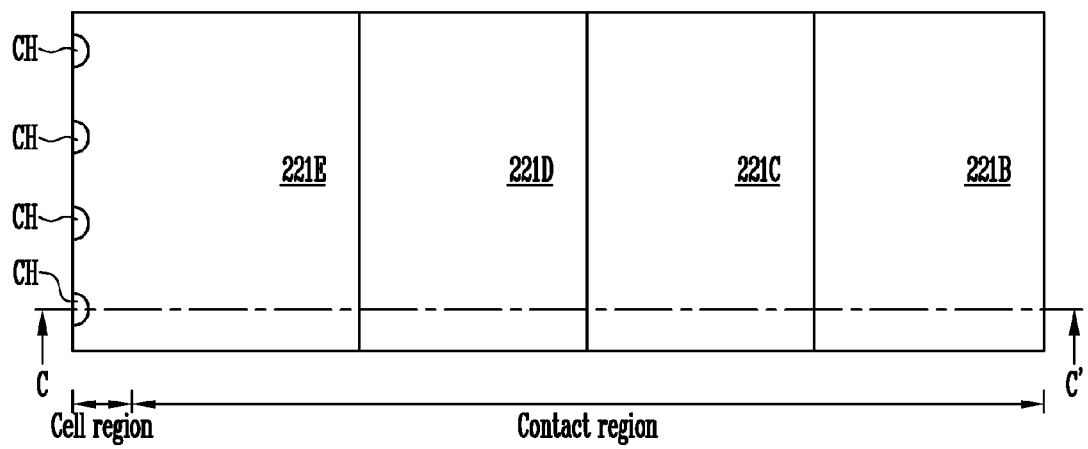
FIG. 4a and FIG. 4b are a plan view and a sectional view illustrating a process of forming a channel layer and a process of forming a stepwise structure.
Figure 4B:
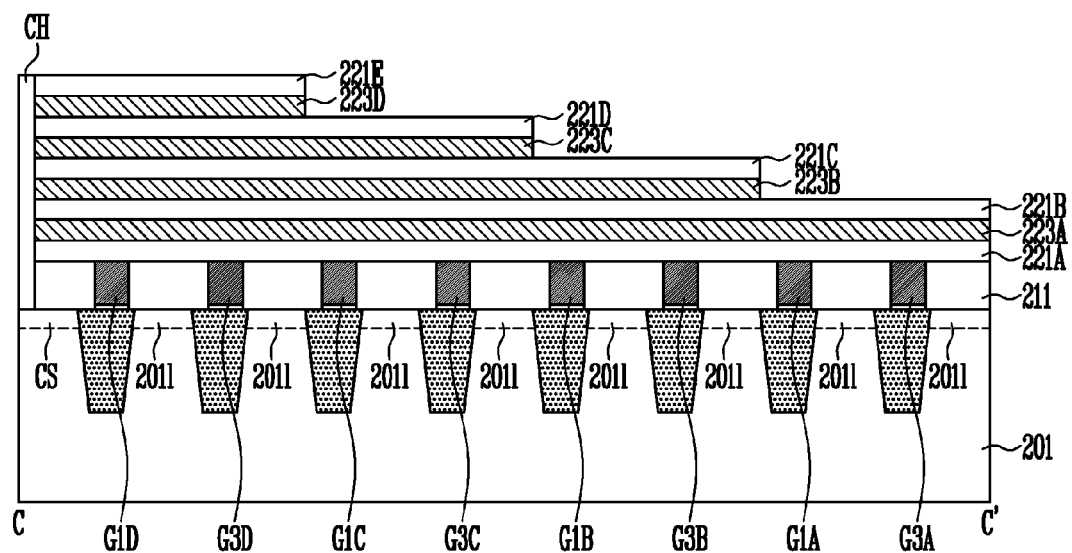

FIG. 4a and FIG. 4b are a plan view and a sectional view illustrating a process of forming the channel layer CH and the process of forming the step structure. FIG. 4b shows a section taken along the line C-C' in FIG. 4a.

In FIG. 4a and FIG. 4b, an insulating layer 211 may be formed over the substrate 201 on which the transistors may be formed, the insulating layer 211 being filled between the gates G1A to G4D. Subsequently, first material layers 221A to 221E and second material layers 223A to 223D may be stacked in turn over the substrate 201 on which the insulating layer 211 is formed. The stack number of the first material layers 221A to 221E and the second material layers 223A to 223D may be variously set. The first material layers 221A to 221E may be formed at a layer on which the interlayer insulating layers are to be formed, and the second material layers 223A to 223D may be formed at a layer on which the conductive lines are to be formed. The first material layers 221A to 221E have high etch selectivity with respect to the second material layers 223A to 223D.

For example, the first material layers 221A to 221E may be formed with an oxide layer for the interlayer dielectric layer, and the second material layers 223A to 223D may be formed with a conductive layer for the conductive line. In an embodiment, the first material layers 221A to 221E may be formed with an oxide layer for the interlayer dielectric layer, and the second material layers 223A to 223D may be formed with a nitride layer for a sacrificial layer. In an embodiment, the first material layers 221A to 221E may be formed with a undoped poly-silicon layer for the sacrificial layer, and the second material layers 223A to 223D may be formed with a doped poly-silicon layer for the conductive line. An insulating layer (not shown) for covering the gates (i.e., G1A to G4D) may be further formed before the first material layers 221A to 221E and the second material layers 223A to 223D are formed.

After the first material layers 221A to 221E and the second material layers 223A to 223D may be formed, holes through the first material layers 221A to 221E and the second material layers 223A to 223D may be formed in the cell region, and the channel layers CH may be respectively formed in the holes. At least one of a charge blocking layer, a charge trap layer and a tunnel insulating layer may be formed along sidewall of the hole, before the channel layer CH is formed. The channel layer CH may fully fill the hole or be formed along the sidewall of the hole to have a tube shape. In the event that the channel layer CH has tube shape, space of the tube defined by the channel layer CH may be filled with an insulating material. The charge blocking layer may be formed with an oxide layer, the charge trap layer may be formed with a nitride layer trappable electric charges, and the tunnel insulating layer may be formed with a silicon oxide layer. The channel layer CH may be formed with a semiconductor layer, e.g. a poly-silicon layer.

Subsequently, an etch mask may be formed on the first material layers 221A to 221E and the second material layers 223A to 223D. The etch mask may be photoresist pattern patterned through a photolithography process. The first material layer 221E and the second material layer 223D, which are uppermost layers of the first material layers 221A to 221E and the second material layers 223A to 223D, may be etched by using the etch mask as an etch barrier. Next, the etch mask is etched, and thus size of the etch mask reduces. As a result, the first and the second material layers 221E and 223D as the uppermost layers and the first and the second material layers 221D and 223C located below the uppermost layers are exposed. Subsequently, the exposed part of the first and the second material layers 221E, 223D, 221D and 223C may be etched by using the etch mask having a reduced size as the etch barrier. The etch process of reducing the size of the etch mask and the process of etching the first material layer and the second material layer may be iteratively performed until the first material layer 223A as the lowest layer is exposed by using the etch mask, and then the etch mask may be removed. As a result, the first material layers 221A to 221E and the second material layers 223A to 223D may be patterned with the stepwise structure in the contact region.

Figure 5A:
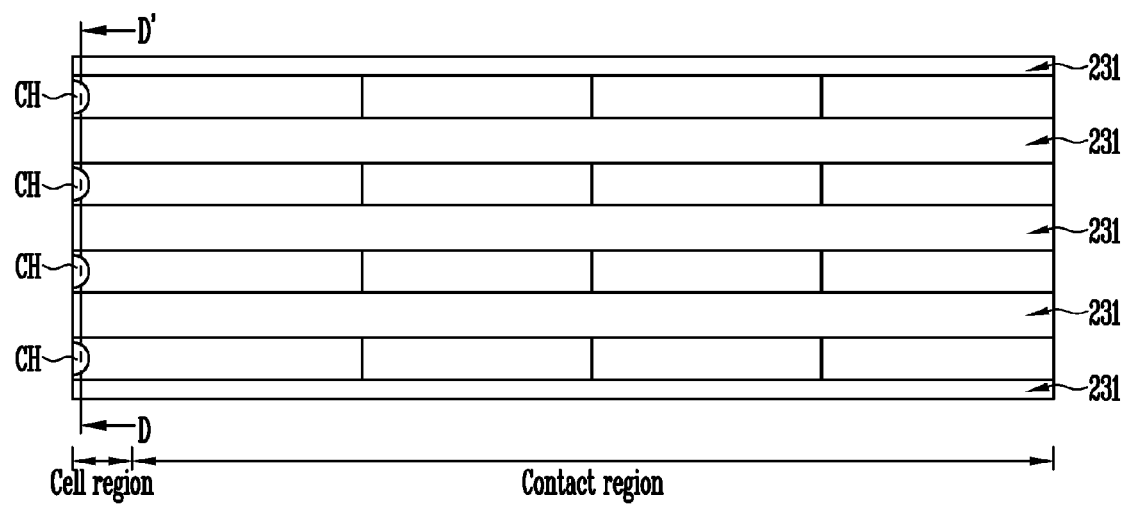
FIG. 5a to FIG. 5c are a plan view and sectional views illustrating a process of forming conductive lines separated by a slit.
Figure 5B:
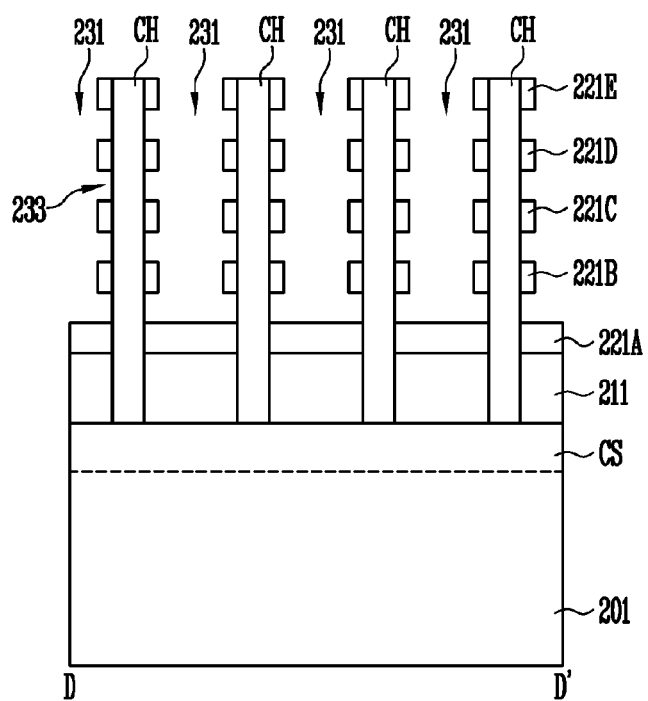
Figure 5C:
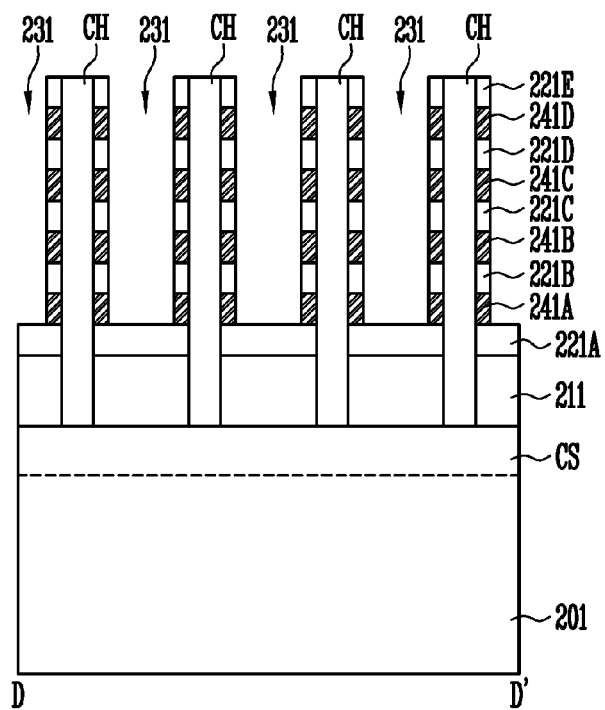

FIG. 5a to FIG. 5c are plan views and sectional views illustrating a process of forming conductive lines separated by a slit. FIG. 5b and FIG. 5c show sections taken along the line D-D' in FIG. 5a.

In FIG. 5a and FIG. 5b, an insulating layer (not shown) for covering the first material layers 221A to 221E and the second material layers 223A to 223D patterned with the stepwise structure may be formed, and then a surface of the insulating layer may be planarized. An etching process for forming a slit 231 may be performed, the slit 231 dividing the first material layers 221A to 221E and the second material layers 223A to 223D in the unit of a memory block. The slit 231 may be extended substantially in the direction crossing over the active region ACT and the isolation layer 205.

In the event that the first material layers 221A to 221E are formed with an oxide layer for the interlayer dielectric layer and the second material layers 223A to 223D are formed with a nitride layer for the sacrificial layer, conductive layer trenches 233 may be formed by removing the second material layers 223A to 223D exposed through the slit 231.

In FIG. 5c, the conductive layer trenches 233 are filled with a conductive layer, and the conducive layer formed in the slit 231 is removed by an etch process. As a result, the conductive lines 241A to 241D may be formed in the conductive layer trenches 233. One or more of the charge blocking layer, the charge trap layer and the tunnel insulating layer may be formed before the conductive layer trenches 233 are filled with the conductive layer. Especially, a layer, not formed along a surface of the hole before the channel layer CH is formed, of the charge blocking layer, the charge trap layer and the tunnel insulating layer may be further formed along surfaces of the conductive layer trenches 233.

In the event that the first material layers 221A to 221E are formed with an oxide layer for the interlayer dielectric layer and the second material layers 223A to 223D are formed with an conductive layer for the conductive line, the second material layers 223A to 223D may be divided into the conductive lines 241A to 241D by the slit 231, which is not shown.

In the event that the first material layers 221A to 221E are formed with an undoped poly-silicon layer for the sacrificial layer and the second material layers 223A to 223D are formed with a doped poly-silicon layer for the conductive line, the second material layers 223A to 223D may be divided into the conductive lines 241A to 241D by the slit 231. Subsequently, insulating layer trenches may be formed by removing the first material layers 221A to 221E exposed through the slit 231. Next, the insulating layer trenches may be filled with the interlayer insulating layer.

Figure 6A:
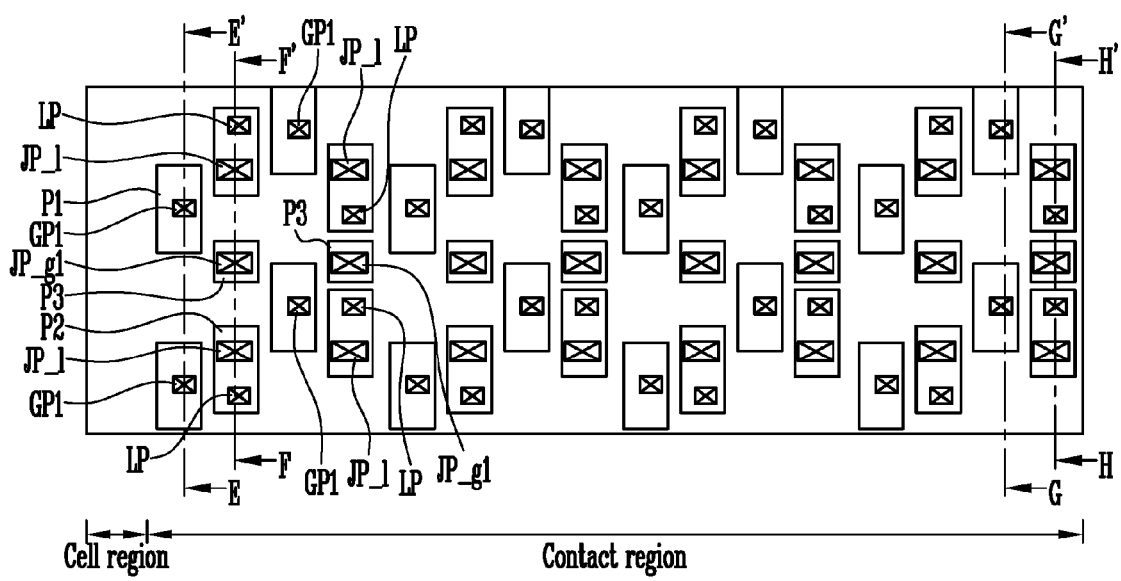
FIG. 6a to FIG. 6e are a plan view and sectional views illustrating a process of forming a first contact plug group and pad patterns.
Figure 6B:
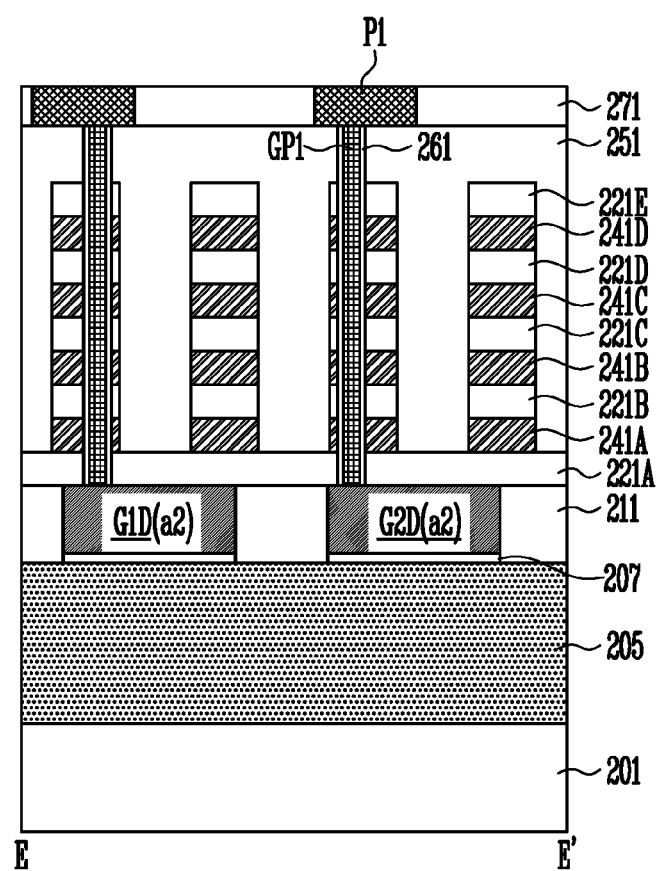
Figure 6C:
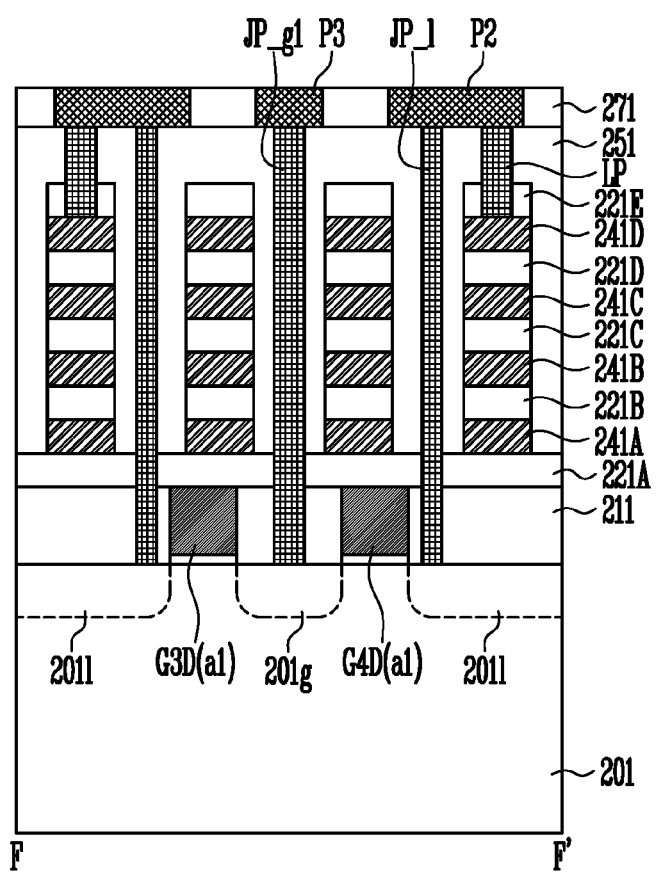
Figure 6D:
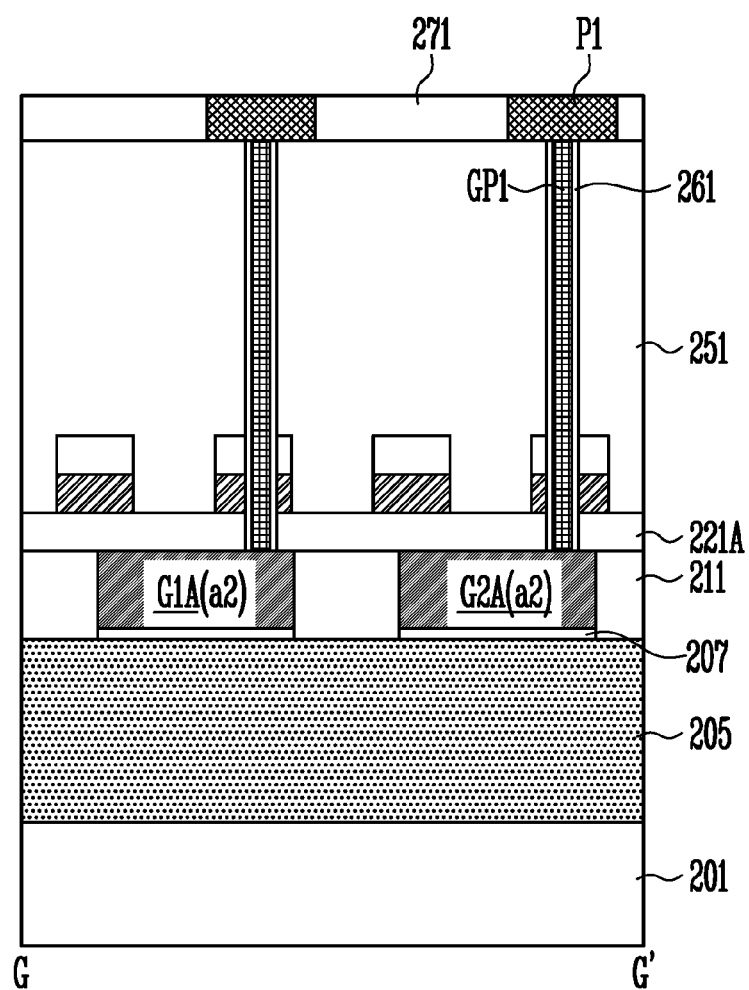
Figure 6E:
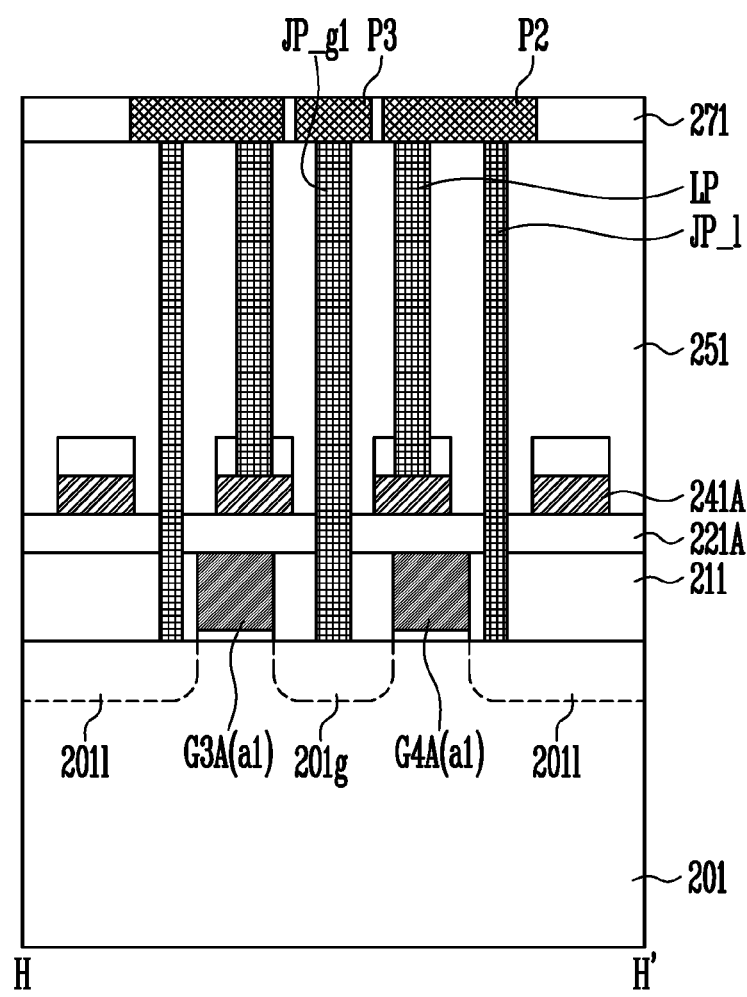

FIG. 6a to FIG. 6e are plan views and sectional views illustrating a process of forming a first contact plug group GP1, JP_g1, JP_l and LP and pad patterns P1 to P3. FIG. 6b shows a section taken along the line E-E' in FIG. 6a, and FIG. 6c illustrates a section taken along the line F-F' in FIG. 6a. FIG. 6d shows a section taken along the line G-G' in FIG. 6a, and FIG. 6e illustrates a section taken along the line H-H' in FIG. 6a.

In FIG. 6a to FIG. 6e, an insulating layer 251 filling in the slit 231 and covering a memory block is formed. Subsequently, gate contact holes (CT in FIG. 1) for exposing the gates G1A to G4D may be formed through the insulating layer 251, the conductive lines 241A to 241D and the interlayer dielectric layer 221A to 221E. The gate contact holes may be disposed with a zigzag shape. Next, an insulating layer 261 may be formed on sidewalls of the gate contact holes. Subsequently, first gate contact plugs GP1 may be formed by filling a conductive layer in the gate contact holes. As a result, the first gate contact plugs GP1 may be connected to the gates G1A to G4D. Particularly, the first gate contact plugs GP1 may be connected to the second parts a2 of the gates G1A to G4D. The first gate contact plugs GP1 may be disposed with zigzag shape.

Contact holes for exposing the impurity regions 201l and 201g through the insulating layers 251, 221A and 211 between the memory blocks may be formed, and then the contact holes may be filled with a conductive layer. As a result, contact plugs JP_g1, JP_l connected to the impurity regions 201l and 201g may be formed. Particularly, local contact plugs JP_l may be connected to the sources 201l of the transistors, and first global contact plugs JP_g1 may be connected to the drains 201g of the transistors formed between the gates in the first and the second groups.

Contact holes may be formed by etching the insulating layer 251 on each of the conductive lines 241A to 241D formed with the stepwise structure in the contact region, and the contact holes may be filled with a conductive layer. As a result, a line contact plug LP connected to the conductive lines 241A to 241D is formed.

Contact holes for exposing the channel layers CH passing through the insulating layer 251 may be formed, which is not shown. Next, the contact holes may be filled with a conductive layer, and so first drain plugs connected to the channel layer CH may be further formed.

The forming order of the first gate contact plugs GP1, the first global contact plugs JP_g1, the local contact plugs JP_l, the line contact plug LP and the first drain contact plugs may be variously modified. Subsequently, an insulating layer 271 is formed, it covering the first gate contact plugs GP1, the first global contact plugs JP_g1, the local contact plugs JP_l, the line contact plug LP and the first drain contact plugs.

Next, pad holes may be formed by etching the insulating layer 271. The pad hole exposes each of the first gate contact plugs GP1 and the first global contact plugs JP_g1, or exposes simultaneously a pair of adjoining local contact plug JP_l and line contact plug LP. Contact holes (not shown) for exposing the first drain contact plugs may be further formed while performing the etching process of forming the pad holes. Subsequently, the pad holes may be filled with a conductive layer. In this time, the contact holes for exposing the first drain contact plugs may also be filled with a conductive layer. As a result, a first pad pattern P1 connected to the first gate contact plug GP1, a second pad pattern P2 for connecting adjacent local contact plug JP_l and line contact plug LP and a third pad pattern P3 connected to the first global contact plug JP_g1 may be formed. Second drain contact plugs (not shown) connected to the first drain contact plugs may be further formed.

Figure 7A:
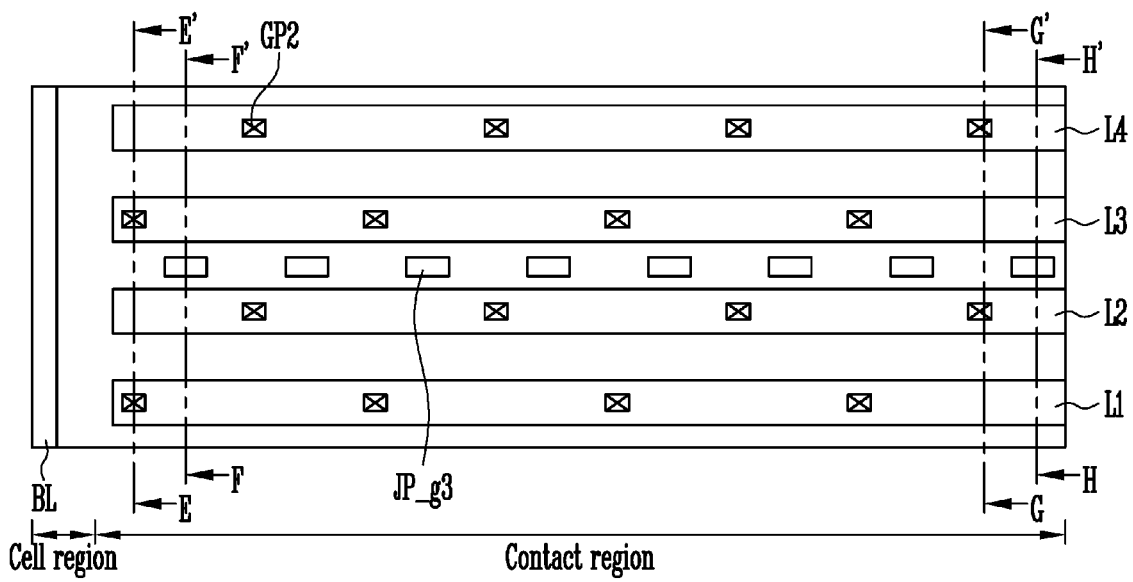
FIG. 7a to FIG. 7e are a plan view and section views illustrating a process of forming a second contact plug group, metal wirings of a first group and a third global contact plugs.
Figure 7B:
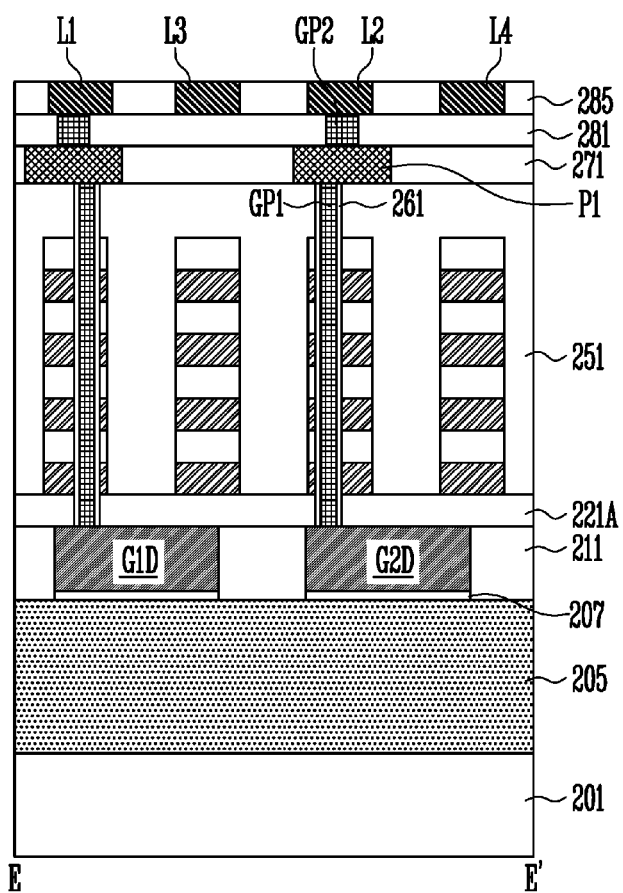
Figure 7C:
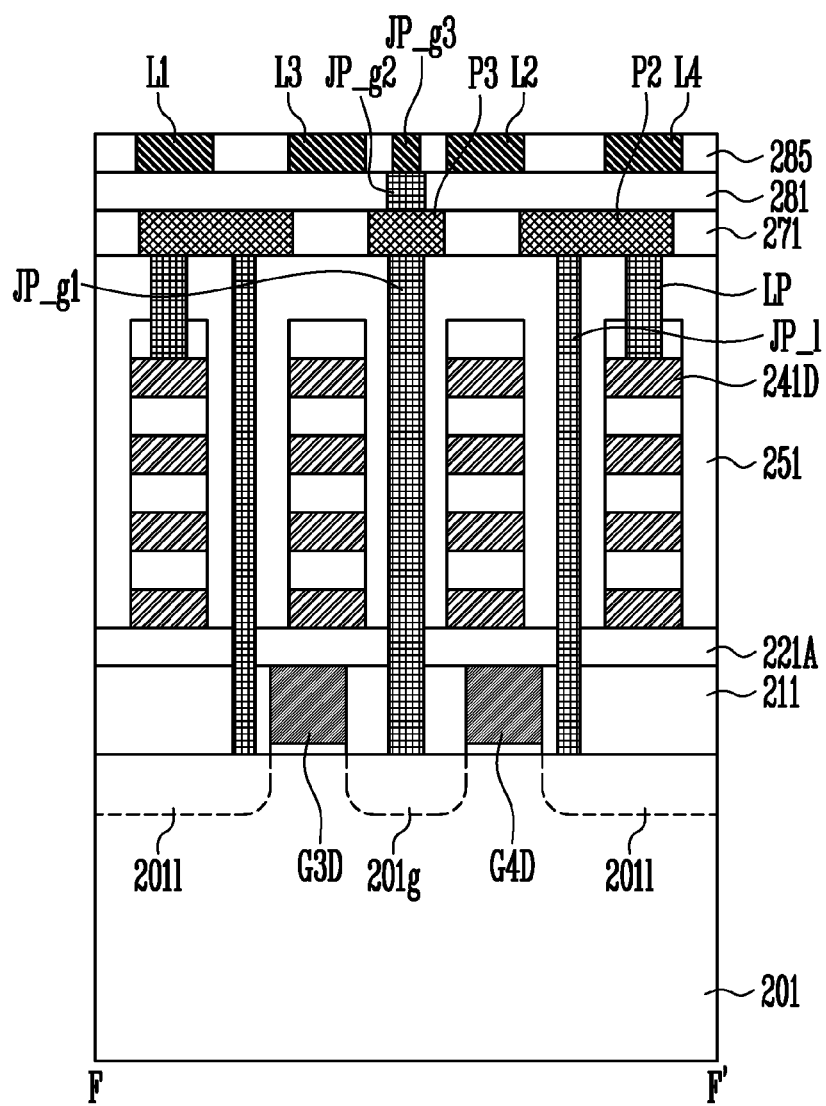
Figure 7D:
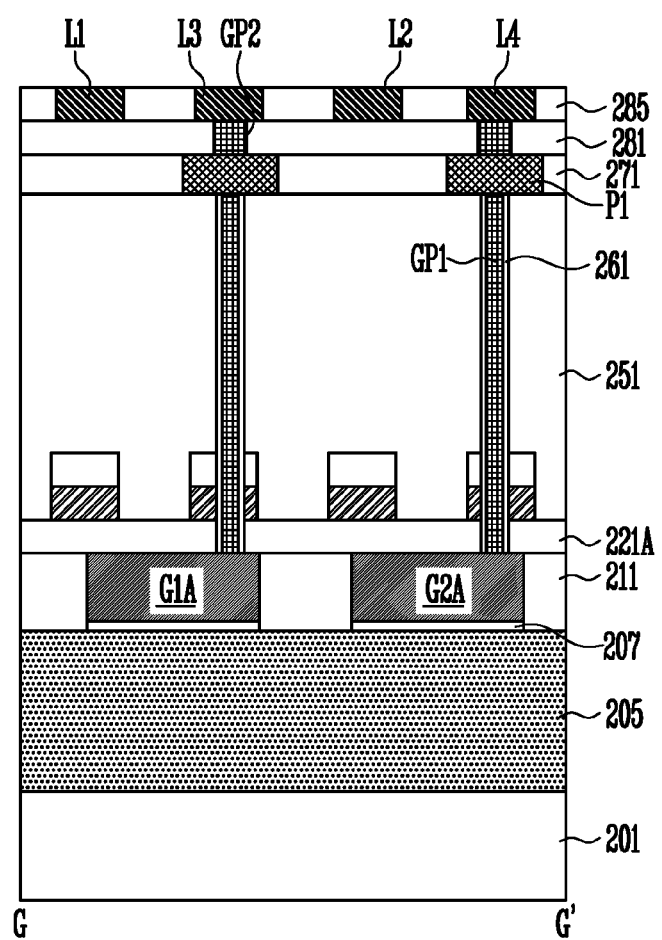
Figure 7E:
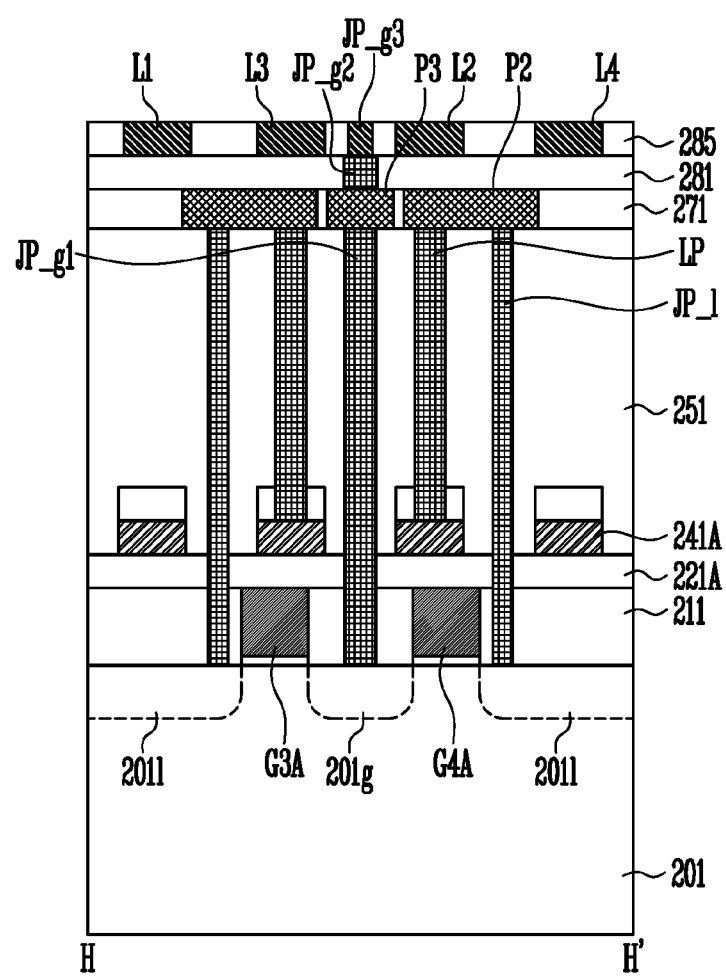

FIG. 7a to FIG. 7e illustrate a plan view and section views illustrating a process of forming a second contact plug group GP2, JP_g2, metal wirings L1 to L4 of a first group and a third global contact plugs JP_g3. FIG. 7b shows a section taken along the line E-E' in FIG. 7a, and FIG. 7c illustrates a section taken along the line F-F' in FIG. 7a. FIG. 7d shows a section taken along the line G-G' in FIG. 7a, and FIG. 7e illustrates a section taken along the line H-H' in FIG. 7a.

In FIG. 7a to FIG. 7e, an insulating layer 281 for covering the pad patterns P1 to P3 may be formed on the insulating layer 271 including the pad patterns P1 to P3. Subsequently, contact holes for exposing the first pad patterns P1 and the third pad patterns P3 through the insulating layer 281 may be formed. Contact holes (not shown) for exposing the second drain contact plugs may be further formed. Next, the contact holes may be filled with a conductive layer. As a result, a second gate contact plug GP2 connected to the first pad pattern P1 may be formed on the first pad pattern P1, a second global contact plug JP_g2 connected to the third pad pattern P3 may be formed on the third pad pattern P3, and third drain contact plugs (not shown) connected to the second drain contact plugs may be formed.

Subsequently, an insulating layer 285 may be formed on the insulating layer 281 including the second gate contact plugs GP2, the second global contact plugs JP_g2 and the drain contact plugs, it covering the second gate contact plugs GP2 and the second global contact plugs JP_g2. Next, trenches for exposing the second gate contact plugs GP2 and contact holes for exposing the second global contact plugs JP_g2 may be formed. The trenches and the contact holes pass through the insulating layer 285. In this time, trenches for exposing the third drain contact plugs may be further formed.

Subsequently, the trenches and the contact holes may be filled with a conductive layer. As a result, the metal wirings L1 to L4 of the first group connected to the second gate contact plugs GP2, a third global contact plug JP_g3 connected to the second global contact plug JP_g2 and bit lines BL connected to the third drain contact plugs may be formed.

The metal wirings L1 to L4 of the first group may be extended in the direction crossing over the active region ACT and the isolation layer 205 in the contact region. As a result, each of the metal wirings L1 to L4 may be connected in common to the second gate contact plugs GP2 disposed in a line. The metal wires L1 to L4 may transmit the block select signal for selecting the memory block. For example, in the event that a first to a fourth memory blocks may be formed, a first metal wiring L1 transmits a block select signal for selecting the first memory block, a second metal wiring L2 transmits a block select signal for selecting a second memory block, a third metal wiring L3 transmits a block select signal for selecting a third memory block, and a fourth metal wiring L4 transmits a block select signal for selecting the fourth memory block. The gates may be connected in common to each of the first to the fourth metal wirings L1 to L4 via the first and the second contact plugs GP1 and GP2 and the first pad pattern P1. For example, the gates G1A, G1B, G1C and GM of the transistors for controlling the first memory block may be connected to the first metal wiring L1 via the first and the second contact plugs GP1 and GP2 and the first pad pattern P1. The gates G2A, G2B, G2C and G2D of the transistors for controlling the second memory block may be connected to the second metal wiring L2 via the first and the second contact plugs GP1 and GP2 and the first pad pattern P1. The gates G3A, G3B, G3C and G3D of the transistors for controlling the third memory block may be connected to the third metal wiring L3 via the first and the second contact plugs GP1 and GP2 and the first pad pattern P1. The gates G4A, G4B, G4C and G4D of the transistors for controlling the fourth memory block may be connected to the fourth metal wiring L4 via the first and the second contact plugs GP1 and GP2 and the first pad pattern P1.

Figure 8A:
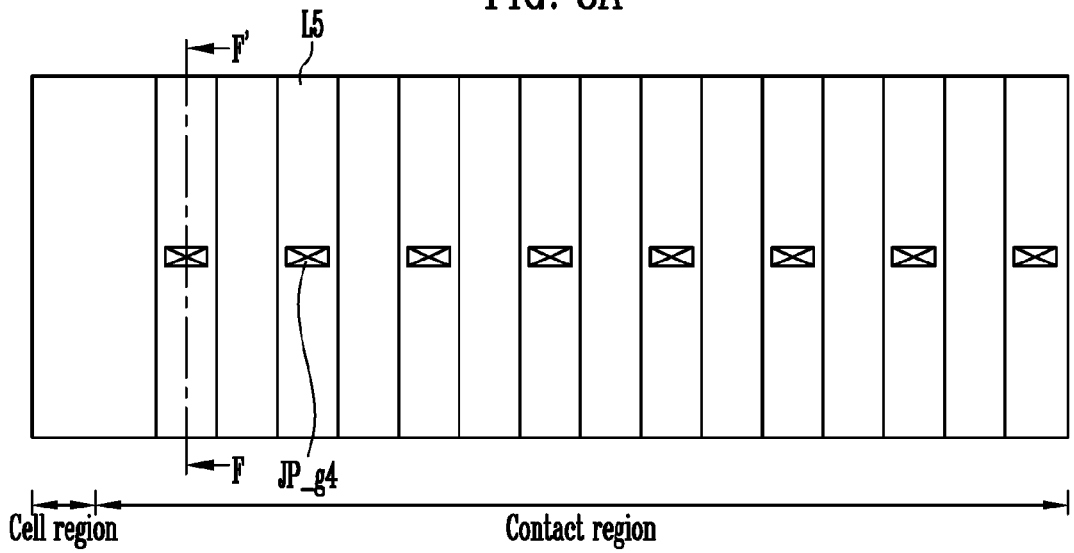
FIG. 8a and FIG. 8b are a plan view and a sectional view illustrating a process of forming fourth global contact plugs and second group metal wirings.
Figure 8B:
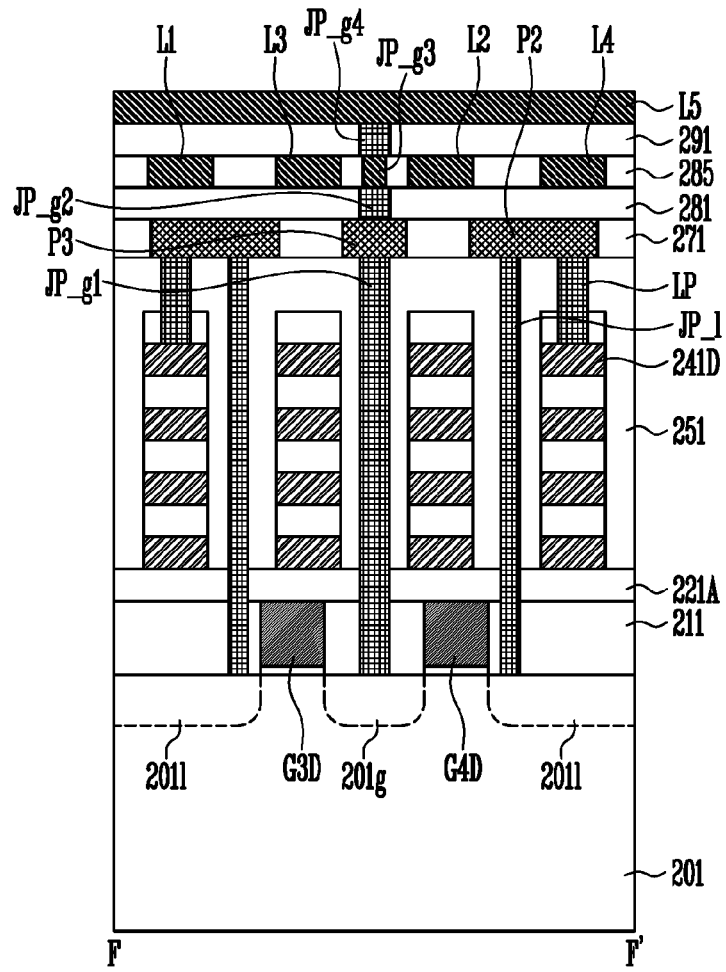

FIG. 8a and FIG. 8b are a plan view and a sectional view illustrating a process of forming fourth global contact plugs JP_g4 and second group metal wirings L5. FIG. 8b shows a section taken along the line F-F' in FIG. 8a.

In FIG. 8a and FIG. 8b, an insulating layer 291 may be formed on the insulating layer 285 including the metal wirings L1 to L4 of the first group and the third global contact plugs JP_g3, it covering the metal wirings L1 to L4 of the first group and the third global contact plugs JP_g3. Subsequently, contact holes for exposing the third global contact plugs JP_g3 through the insulating layer 291 may be formed. Next, the contact holes may be filled with a conductive layer. As a result, fourth global contact plugs JP_g4 connected to the third global contact plug JP_g3 may be formed on the third global contact plugs JP_g3.

Subsequently, metal wirings L5 of a second group connected to the fourth global contact plugs JP_g4 may be formed on the insulating layer 291 including the fourth global contact plugs JP_g4. The metal wirings L5 of the second group may be used as global lines for delivering the operation voltages to be supplied to the memory blocks. The metal wirings L5 of the second group may be extended in the direction crossing over the metal wirings L1 to L4 of the first group.

As described above, the present embodiments form gates, sources and drains of the transistors, especially pass transistors in the contact region of the memory block, thereby reducing an area of the peripheral region. The pass transistors deliver the operation voltages to the memory blocks in response to the block select signals. The present embodiments have the substrate 201 including the isolation layer 205 and the active region ACT disposed alternately in the contact region, and extends the isolation layer 205 and the active region ACT of the substrate 201 in the direction crossing over the conductive lines of the memory block, the cell region and the contact region being defined in the substrate 201. As a result, the sources and the drains formed in the active region ACT are opened between the memory blocks, the contact plugs connected to the sources and the drains of the pass transistors are not formed in the peripheral region but may be formed between the memory blocks. The present embodiments form the gates of the pass transistors below the conductive lines of the memory block, and form the contact plug passing through the conductive lines of the memory block and connected to the gates of the pass transistors. As a result, the present embodiment does not form the gate of the pass transistor and the contact plug connected to the gate in the peripheral region, but may form the gate and the contact plug in the contact region.

The pass transistors in the semiconductor device of the present embodiments supply the operation voltage provided from the metal wirings L5 of the second group to the conductive lines 241A to 241D of the memory blocks BLK1 to BLK4, in response to the block select signals transmitted from the metal wirings L1 to L4 of the first group.

Figure 9:
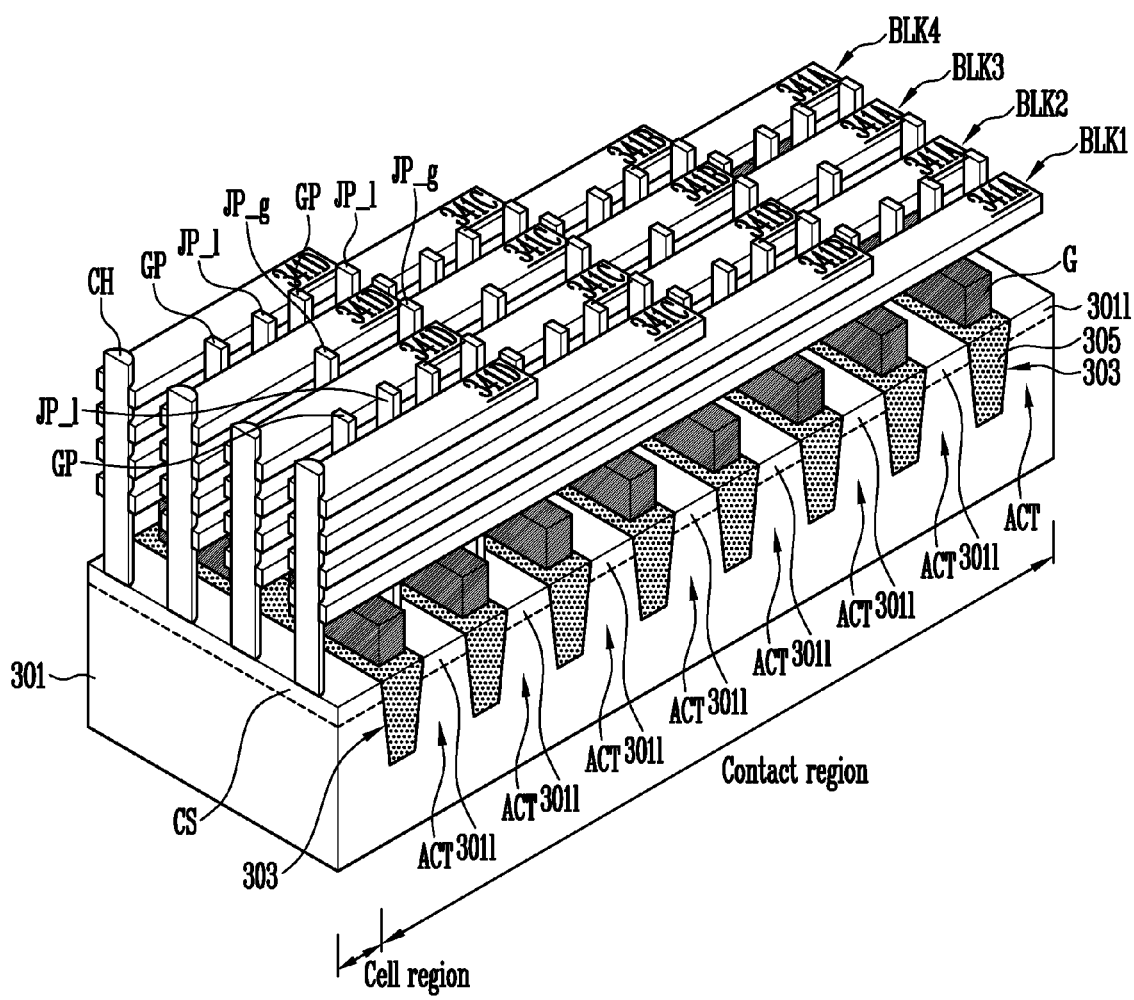
FIG. 9 is a view illustrating a semiconductor device according to second embodiments of the present invention.

FIG. 9 is a view illustrating a semiconductor device according to second embodiments of the present invention.

In FIG. 9, a semiconductor device of the present embodiments may include a cell region and a contact region. Memory blocks BLK1 to BLK4 may be formed over a substrate 301 where the cell region and the contact region are defined. Transistors, for delivering operation voltages to the memory blocks BLK1 to BLK4 in response to a block select signal, may be formed in the contact region. The memory blocks BLK1 to BLK4 may be disposed over the transistors. The present embodiments do not form the transistors in a peripheral region, but form the transistors in the contact region. As a result, the present embodiments may reduce the area of the peripheral region.

Each of the memory blocks BLK1 to BLK4 may include a channel layer CH projected from the substrate 301 in the cell region and conductive lines 341A to 341D stacked over the substrate 301, the conductive lines 341A to 341D covering the channel layer CH and being divided in the unit of the memory block BLK1 to BLK4. The conductive lines 341A to 341D may be extended in the direction from the cell region to the contact region. The conductive lines 341A to 341D may be further projected in the direction of the contact region according as space between corresponding conductive line and the substrate 301 gets smaller. That is, the conductive lines 341A to 341D may be patterned with a stepwise structure in the contact region. An interlayer dielectric layer (not shown) may be formed between adjacent conductive lines 341A to 341D. The stack number of the conductive lines 341A to 341D may be variously changed according to the number of memory cells to be stacked and the number of select transistors to be stacked.

The conductive lines 341A to 341D may be used as a select line or a word line as described in FIG. 1a. A select transistor or the memory cell may be formed in cross area of the conductive lines 341A to 341D and the channel layer CH as described in FIG. 1a. As a result, a memory string including the memory cells coupled in serial through the channel layer CH is formed. The channel layer CH of the memory string may be connected to a cell source region CS formed in the substrate 301 or on the substrate 301 in the cell region. Multilayer including a tunnel insulating layer, a charge trap layer and a charge blocking layer may be formed between the conductive lines 341A to 341D and the channel layer CH.

An isolation region and an active region ACT may be alternately disposed in the contact region. The isolation region and the active region ACT may be extended in the direction crossing the conductive lines 341A to 341D. A trench 303 and an isolation layer 305 dividing the active region ACT may be formed in the isolation region, the trench 303 being filled with the isolation layer 305.

Each of the transistors formed in the contact region may include a gate G formed over the substrate 301 and impurity regions formed in the active region ACT at both sides of the gate G. Each of the gates G may include a first part formed over the active region ACT in the direction crossing the active region ACT and a second part extended from the first part, the second part being formed over the isolation layer 305 and being extended in the direction crossing the conductive lines 341A to 341D. The first part and the second part of the gate G will be described in detail with reference to accompanying drawing FIG. 11a. The impurity regions may be used as a source 301l or a drain of the transistor.

The present embodiments form the active region ACT and the second part of the gate G in the direction crossing the conductive lines 341A to 341D, and so the source 301l and the drain of the transistor formed in the active region ACT and the second part of the gate G may be opened between the memory blocks BLK1 to BLK4. Accordingly, the present embodiments may dispose a gate contact plug GP connected to the gate G of respective transistors and contact plugs GP, JP_l and JP_g to be connected to the source 301l and the drain of respective transistors in the contact region between the memory blocks BLK1 to BLK4. The present embodiments may form regularly patterned pad patterns for connecting the contact plugs JP_l and JP_g. The contact plugs GP, JP_l and JP_g and the pad patterns will be described in detail with reference to accompanying drawings FIG. 10a to FIG. 11b.

Hereinafter, a method of manufacturing the semiconductor device of the present embodiments will be described in detail with reference to accompanying drawings FIG. 10a to FIG. 11b.

Figure 10A:
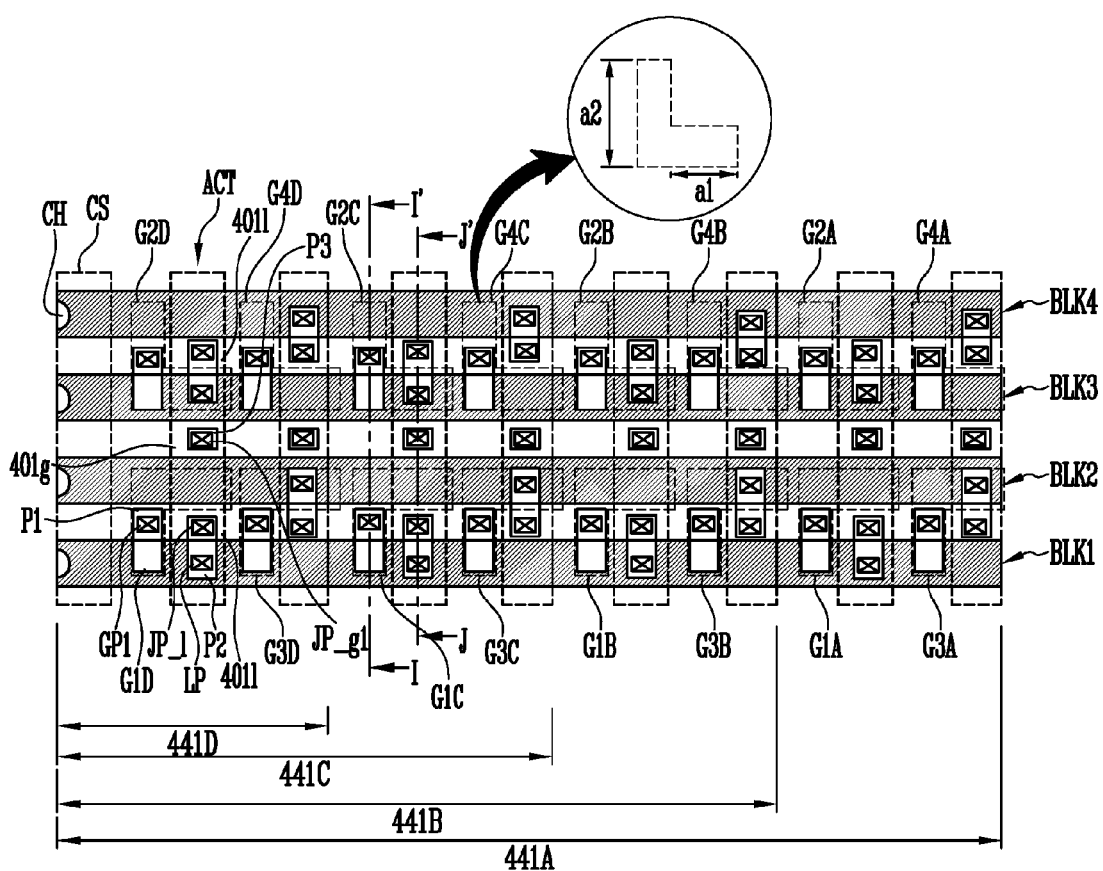
FIG. 10a to FIG. 10c are a plan view and sectional views illustrating steps from a process of forming an isolation layer and an active region to a process of forming pad patterns.
Figure 10B:
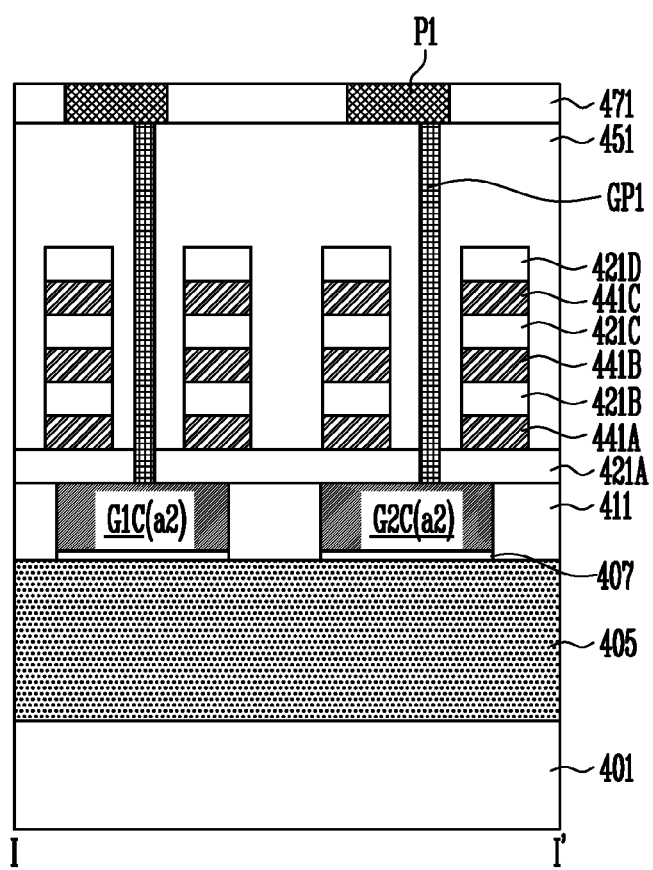
Figure 10C:
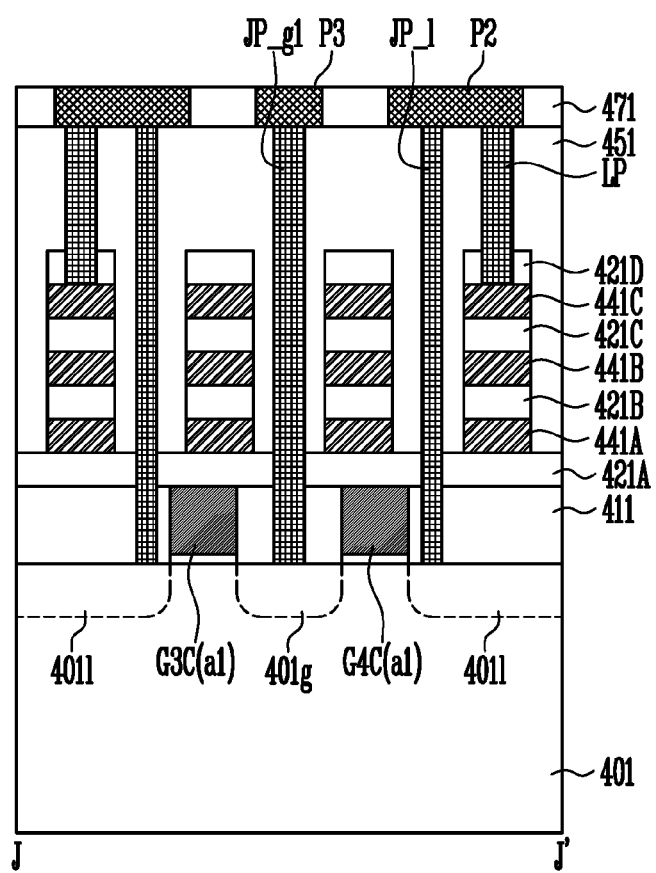

FIG. 10a to FIG. 10c are plan views and sectional views illustrating steps from a process of forming the isolation layer 305 and the active region ACT to a process of forming the pad patterns P1 to P3. FIG. 10a shows a projective view of the structure of the active region ACT, the gate G and the conductive lines 441A to 441C so as to describe definitely disposition relation of the active region ACT, the gate G and the conductive lines 441A to 441C. FIG. 10b illustrates a section taken along the line I-I' in FIG. 10a, and FIG. 10c shows section taken along the line J-J' in FIG. 10a.

In FIG. 10a and FIG. 10b, trenches may be formed in the contact region of a substrate 401 as described in FIG. 2a and FIG. 2b, and the trenches may be filled with an isolation layer 405. As a result, the active regions ACT of the substrate 401 divided by the isolation layers 405 are defined in the contact region. The isolation layers 405 and the active regions ACT may be alternately disposed in the contact region.

Subsequently, a gate insulating layer 407 of the transistor, gates G1A to G4D and impurity regions CS, 401g and 401l may be formed as described in FIG. 3a and FIG. 3b. Each of the gates G1A to G4D may include a first part a1 formed over the active region ACT and a second part a2 formed over the isolation layer 405 that extend from the first part a1. The first part a1 may be extended in the direction crossing over the active region ACT, and the second part a2 may be extended in the direction crossing over the first part a1. The gates G1A to G4D may be divided into gates G1D, G3D, G1C, G3C, G1B, G3B, G1A and G3A of a first group for transistors for delivering operation voltages to odd-numbered memory blocks BLK1 and BLK3 and gates G2D, G4D, G2C, G4C, G2B, G4B, G2A and G4A of a second group for transistors for delivering operation voltages to even-numbered memory blocks BLK2 and BLK4. The number of the gates in each of the groups is substantially identical to that of conductive lines to be stacked over the substrate 401. The first part a1 of the gates in the first group and the first part a1 of the gates in the second group may face each other, and be symmetrically disposed. The active region ACT may be opened at both sides of each of the gates in the first and the second groups.

First impurity regions 401g and 401l may be formed by injecting impurities in the active region ACT opened at both sides of the gates G1A to G4D as described in FIG. 3a and FIG. 3b, they corresponding to the source and drain of each of the transistors. A second impurity region CS may be formed on the substrate 401 in the cell region, it corresponding to a cell source region to be connected to the memory string. Second impurity regions formed in the active regions ACT between the gates in the first and the second groups may become the drains 401g, and the other second impurity regions may become the sources 401l. As a result, the transistors including the gate, the source and the drain may be formed. The transistors may be divided into transistors in a first group for delivering operation voltages to odd-numbered memory blocks and transistors in a second group for delivering operation voltages to even-numbered memory blocks. Adjacent transistors in the first and the second groups may share the drain 401g.

Subsequently, an insulating layer 441 filling in the gates G1A to G4D may be formed as described in FIG. 4a and FIG. 4b, and then first material layers and second material layers may be stacked in turn. Next, the channel layer CH passing through the first material layers and the second material layers may be formed as described in FIG. 4a and FIG. 4b, and the first material layers and the second material layers may be patterned with the stepwise structure. Subsequently, conductive lines 441A to 441D divided by a slit and interlayer dielectric layers 421B to 421D may be formed as described in FIG. 5a to FIG. 5c. As a result, the memory blocks BLK1 to BLK4 may be divided by the slit. Lowest interlayer dielectric layer 421A may not be divided by the slit.

Next, an insulating layer 451, which fills in the slit and covers the memory blocks BLK1 to BLK4, may be formed. Subsequently, a first contact plug group GP1, JP_g1, JP_l and LP passing through at least one insulating layers 451, 421D, 421A and 411 may be formed. The first contact plug group GP1, JP_g1, JP_l and LP may include first contact plugs GP1, first global contact plugs JP_g1, local contact plugs JP_l and line contact plugs LP.

The first gate contact plugs GP1 may be connected to the gates G1A to G4D, particularly may be connected to the second parts a2 of the gates G1A to G4D opened between the memory blocks BLK1 to BLK4. In the present embodiments, the first gate contact plugs GP1 does not pass through the conductive lines 441A to 441C but may be formed through only the insulating layers 451 and 421A. Accordingly, the conductive lines 441A to 441C need not to be etched to form the first gate contact plugs GP1.

The first global contact plugs JP_g1 may be connected to the drains 401g of the transistors opened between the memory blocks BLK1 to BLK4. The local contact plugs JP_l may be connected to the sources 401l of the transistors opened between the memory blocks BLK1 to BLK4. The line contact plugs LP may be connected to the conductive lines 441A to 441C formed with the stepwise structure in the contact region. A pair of the line contact plug LP and the local contact plug JP_l are adjacent.

Next, an insulating layer 471 covering the first gate contact plugs GP1, the first global contact plugs JP_g1, the local contact plugs JP_l and the line contact plug LP may be formed. Subsequently, pad holes may be formed by etching the insulating layer 471. The pad hole exposes each of the first gate contact plugs GP1 and the first global contact plugs JP_g1, or exposes simultaneously a pair of the local contact plug JP_l and the line contact plug LP. Next, the pad holes may be filled with a conductive layer. As a result, a first pad pattern P1 connected to the first gate contact plug GP1, a second pad pattern P2 for connecting adjacent local contact plug JP_l and line contact plug LP and a third pad pattern P3 connected to the first global contact plug JP_g1 may be formed.

Figure 11A:
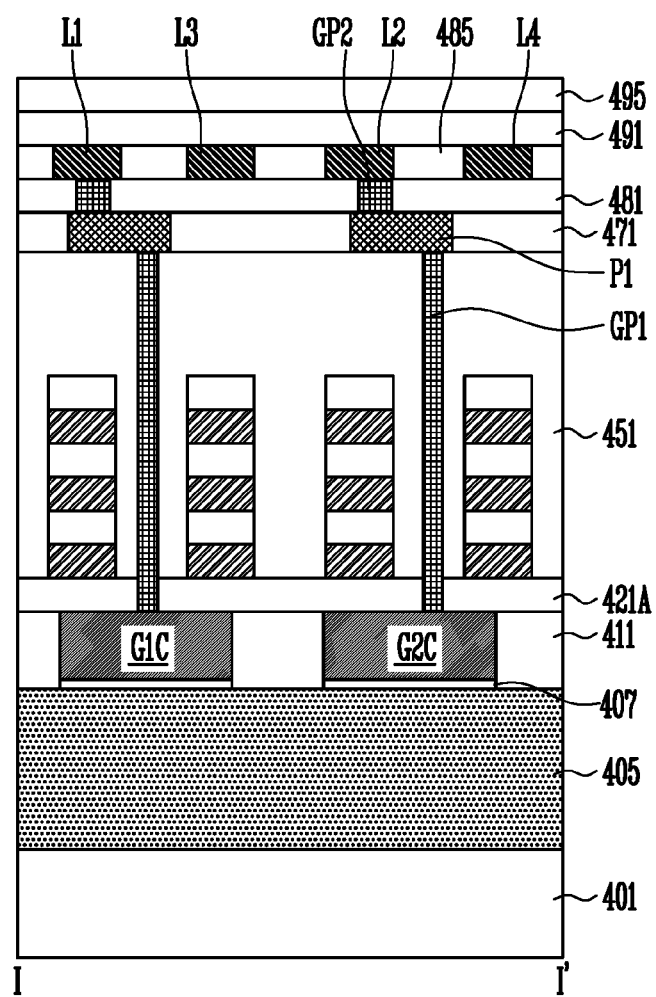
FIG. 11a and FIG. 11b are section views illustrating a process following after forming first to the third pad patterns.
Figure 11B:
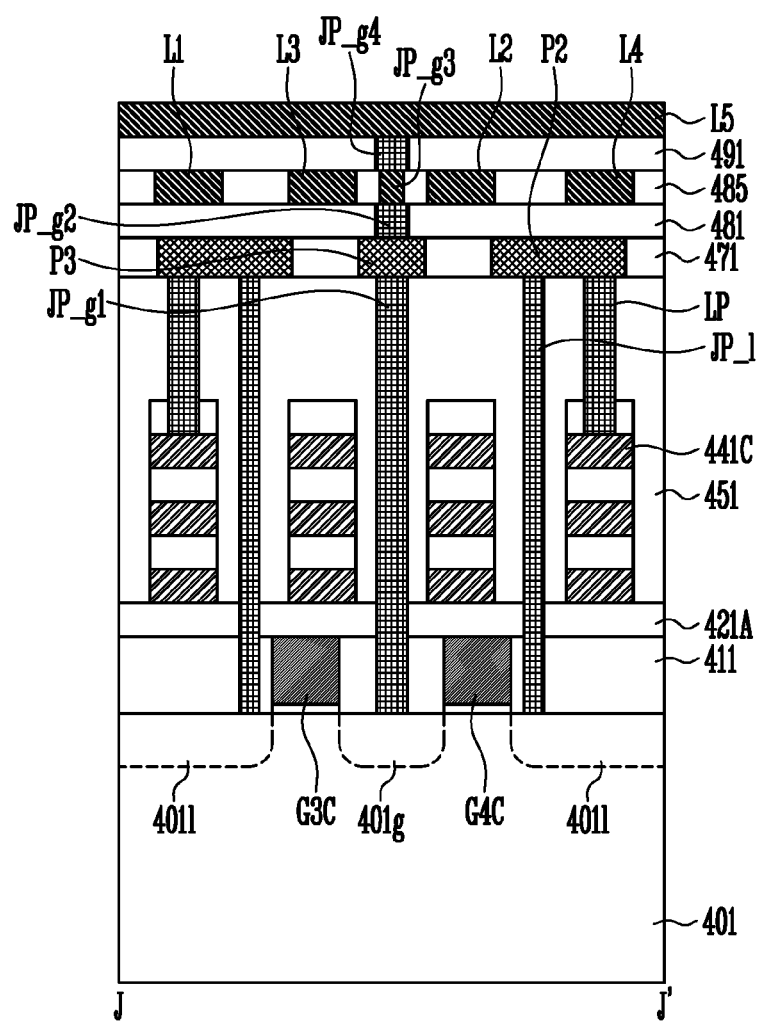

FIG. 11a and FIG. 11b are section views illustrating a process following after forming the first to the third pad patterns P1 to P3.

In FIG. 11a and FIG. 11b, an insulating layer 481 may be formed on the insulating layer 471 including the first to the third pad patterns P1 to P3, and then a second contact plug group GP2 and JP_g2 passing through the insulating layer 481 may be formed. The second contact plug group GP2 and JP_g2 may include a second gate contact plug GP2 formed on the first pad pattern P1 and a second global contact plug JP_g2 formed on the third pad pattern P3, the second gate contact plug GP2 being connected to the first pad pattern P1 and the second global contact plug JP_g2 being connected to the third pad pattern P3.

Subsequently, an insulating layer 485 may be formed on the insulating layer 481 including the second contact plug group GP2 and JP_g2, and then metal wirings L1 to L4 passing through the insulating layer 485 and third global contact plugs JP_g3 may be formed. Layout of the metal wirings L1 to L4 is shown in FIG. 7a. That is, the metal wirings L1 to L4 may be extended in the direction crossing over the active region ACT and the isolation layer 405 in the contact region. As a result, each of the metal wirings L1 to L4 is connected in common to the second gate contact plugs GP2 disposed in a line. The metal wirings L1 to L4 may transmit a block select signal for selecting the memory block. The gates are connected in common to the each of the metal wirings L1 to L4 via the first and the second contact plugs GP1 and GP2 and the first pad pattern P1. Electrical connection relation of the metal wirings L1 to L4 and the gates are shown in FIG. 7a to FIG. 7e. The third global contact plugs JP_g3 may be connected to the second global contact plugs JP_g2.

Next, an insulating layer 491 may be formed on the insulating layer 485 including the metal wirings L1 to L4 and the third global contact plugs JP_g3. Subsequently, fourth global contact plugs JP_g4 passing through the insulating layer 491 and connected to the third global contact plug JP_g3 may be formed.

Next, an insulating layer 495 may be formed on the insulating layer 491 including the fourth global contact plugs JP_g4, and then metal wirings L5 passing through the insulating layer 495 and connected to the fourth global contact plugs JP_g4 may be formed. The metal wirings L5 may be used as global lines for delivering operation voltages to be supplied to the memory blocks.

Figure 12:
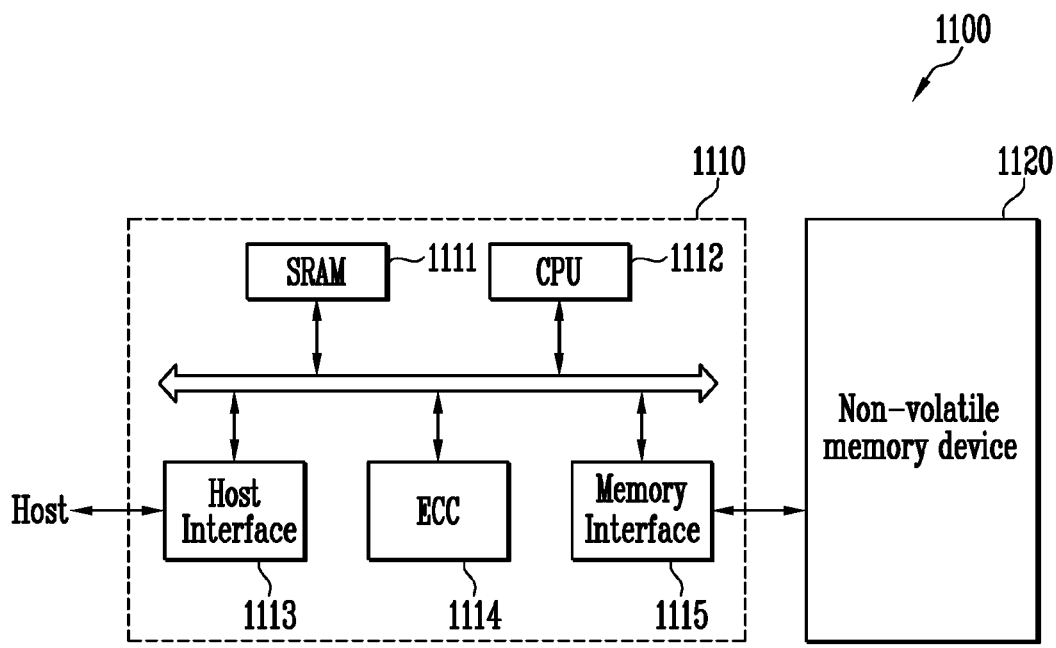
FIG. 12 is a block diagram illustrating a memory system according to an embodiment of the present invention.

FIG. 12 is a block diagram illustrating a memory system according to an embodiment of the present invention.

In FIG. 12, the memory system 1100 of the present embodiments may include a non-volatile memory device 1120 and a memory controller 1110.

The non-volatile memory device 1120 may include the non-volatile memory device described in FIG. 1a to FIG. 11b. The non-volatile memory device 1120 may be multi-chip package including flash memory chips.

The memory controller 1110 controls the non-volatile memory device 1120, and may include an SRAM 1111, a CPU 1112, a host interface 1113, an ECC 1114 and a memory interface 1115. The SRAM 1111 is used as an operation memory of the CPU 1112, the CPU 1112 performs control operation for data exchange of the memory controller 1110, and the host interface 1113 has data exchange protocol of a host accessed to the memory system 1100. The ECC 1114 detects and corrects error of data read from the non-volatile memory device 1120, and the memory interface 1115 interfaces with the non-volatile memory device 1120. The memory system 1100 of the present invention may further include a ROM for storing code data for interfacing with the host and so on.

The memory system 1100 may be a memory card, where the non-volatile memory device 1120 and the controller 1110 are combined, or a solid state disk SSD. For example, in the event that the memory system 1100 is the SSD, the memory controller 1110 communicates with an external device, e.g. host through one of various interface protocols such as USB, MMC, PCI-E, SATA, PATA, SCSI, ESDI, IDE, etc.

Figure 13:
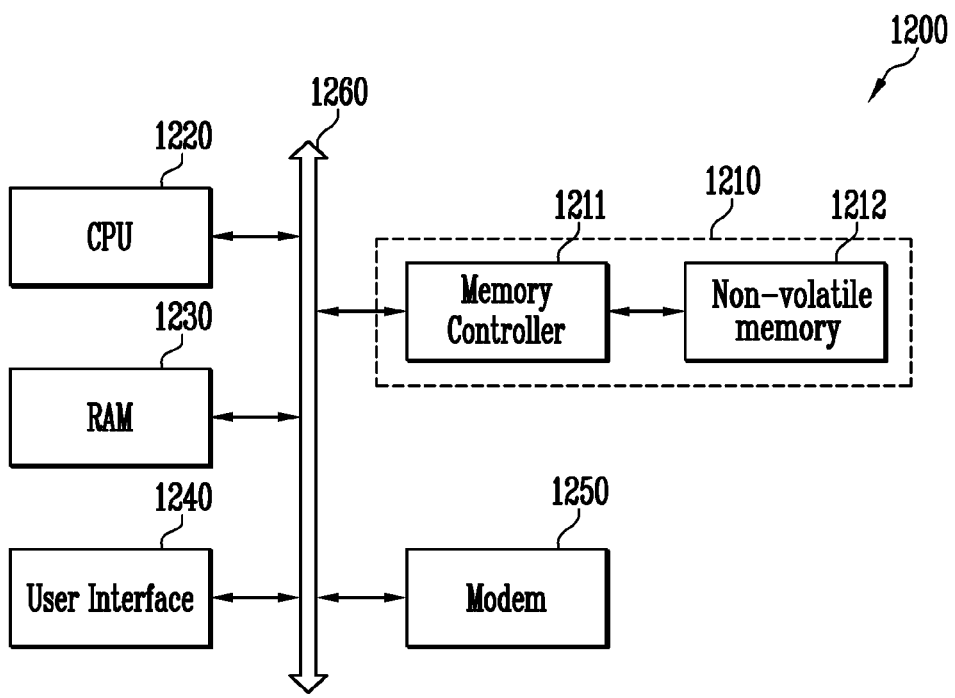
FIG. 13 is a view illustrating a computing system according to an embodiment of the present invention.

FIG. 13 is a view illustrating a computing system (i.e. computer system) according to an embodiment of the present invention.

In FIG. 13, the computing system 1200 of the present invention may include a CPU 1220 connected electrically to a system bus 1260, a RAM 1230, a user interface 1240, a modem 1250 and a memory system 1210. In the event that the computing system 1200 is a mobile device, a battery for supplying an operation voltage of the computing system 1200 may be further provided. The computing system 1200 of the present invention may further include an application chipset, a camera image processor CIS, a mobile DRAM, etc.

The memory system 1210 may include a non-volatile memory 1212 and a memory controller 1211 as described in FIG. 12.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:
1. A semiconductor device comprising:
a substrate where a cell region and a contact region are defined;
isolation regions and active regions disposed alternately in the contact region, wherein the isolation regions and the active regions are extended in a first direction;

transistors configured to include gates formed over the substrate and sources and drains formed in the active regions, in the contact region;

stack structures each including conductive lines stacked on each other over the substrate, the conductive lines being extended from the cell region to the contact region in a second direction crossing the first direction, wherein the stack structures comprise memory blocks, respectively; and contact plugs formed between the stack structures in the contact region.

2. The semiconductor device of claim 1, wherein each of the gates includes:

a first part formed over the active region in the second direction and formed between the source and the drain; and a second part formed over the isolation region extending from the first part in the first direction and opened between the stacked structures.

3. The semiconductor device of claim 2, further comprising:

a first gate contact plug connected to the second part of the gate and projected over the gate.

4. The semiconductor device of claim 3, further comprising:

a first pad pattern connected to the first gate contact plug, on the first gate contact plug;

a second gate contact plug connected to the first pad pattern, on the first pad pattern; and a metal wiring connected to the second gate contact plug and extended in the second direction, on the second gate contact plug.

5. The semiconductor device of claim 3, wherein the first gate contact plug is connected to the second part by passing through the conductive lines.

6. The semiconductor device of claim 5, further comprising:

an insulating layer configured to cover the first gate contact plug.

7. The semiconductor device of claim 3, wherein the first gate contact plug is formed between the stacked structures.

8. The semiconductor device of claim 1, wherein the contact plugs include:

a local contact plug connected to the source and projected over the substrate; and a first global contact plug connected to the drain and projected over the substrate.

9. The semiconductor device of claim 8, further comprising:

a line contact plug connected to one of the conductive lines; and a second pad pattern configured to connect the local contact plug to the line contact plug, on the local contact plug and the line contact plug.

10. The semiconductor device of claim 8, further comprising:

a third pad pattern connected to the first global contact plug, on the first global contact plug;

a second global contact plug connected to the third pad pattern, on the third pad pattern;

a third global contact plug connected to the second global contact plug, on the second global contact plug;

a fourth global contact plug connected to the third global contact plug, on the third global contact plug; and a global line connected to the fourth global contact plug and extended in the first direction, on the fourth global contact plug.

11. The semiconductor device of claim 1, further comprising:

channel layers passing through the conductive lines.

12. The semiconductor device of claim 1, further comprising:

interlayer insulating layers formed between the conductive lines.

13. The semiconductor device of claim 1, wherein the conductive lines configured to have a stepwise structure in the contact region.

14. The semiconductor device of claim 1, wherein the conductive lines include a select line of a select transistor and word lines of memory cells.

15. The semiconductor device of claim 1, wherein the transistors include a first group connected to odd numbered memory blocks of the memory blocks and a second group connected to even numbered memory blocks of the memory blocks.

16. The semiconductor device of claim 1, wherein the sources of the first group and the sources of the second group are disposed along the second direction with the drains interposed therebetween.

17. The semiconductor device of claim 1, wherein the drains are disposed in the second direction.

18. The semiconductor device of claim 1, wherein the transistors are connected to the conductive lines of each of the stacked structures and disposed in the different active regions isolated by the isolation regions.

* * * * *